US011900135B1

(12) United States Patent
Poplack et al.

(10) Patent No.: US 11,900,135 B1
(45) Date of Patent: Feb. 13, 2024

(54) EMULATION SYSTEM SUPPORTING REPRESENTATION OF FOUR-STATE SIGNALS

(71) Applicant: CADENCE DESIGN SYSTEMS, INC., San Jose, CA (US)

(72) Inventors: Mitchell G Poplack, San Jose, CA (US); Yuhei Hayashi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 355 days.

(21) Appl. No.: 16/212,363

(22) Filed: Dec. 6, 2018

(51) Int. Cl.
*G06F 3/00* (2006.01)
*G06F 9/455* (2018.01)

(52) U.S. Cl.
CPC .................. *G06F 9/45504* (2013.01)

(58) Field of Classification Search
CPC .................. G06F 30/331; G06F 9/54
USPC .......................................................... 719/310
See application file for complete search history.

(56) References Cited

U.S. PATENT DOCUMENTS

| | | | | |
|---|---|---|---|---|
| 5,001,713 A * | 3/1991 | Whetsel | ......... | G01R 31/318558 714/E11.16 |
| 5,652,771 A * | 7/1997 | Davis | ......... | H04L 7/042 348/536 |
| 6,026,230 A * | 2/2000 | Lin | ......... | G06F 30/33 703/13 |
| 6,267,673 B1 * | 7/2001 | Miyamoto | ......... | G06T 15/10 463/31 |
| 8,020,131 B1 * | 9/2011 | Van Mau | ......... | G06F 30/34 716/117 |
| 8,244,512 B1 * | 8/2012 | Tseng | ......... | G06F 30/331 703/14 |
| 9,910,944 B2 * | 3/2018 | Rabinovitch | ......... | G06F 30/398 |
| 2007/0219771 A1 * | 9/2007 | Verheyen | ......... | G06F 30/33 703/15 |
| 2013/0007683 A1 * | 1/2013 | Arbel | ......... | G06F 30/327 716/112 |
| 2014/0052430 A1 * | 2/2014 | Suresh | ......... | G06F 30/30 703/14 |
| 2016/0217235 A1 * | 7/2016 | Rabinovitch | ......... | G06F 30/398 |

(Continued)

FOREIGN PATENT DOCUMENTS

JP H08161190 A * 6/1996

OTHER PUBLICATIONS

Brice Colombier, Survey of hardware protection of design data for integrated circuits and intellectual properties. (Year: 2014).*

(Continued)

*Primary Examiner* — Lechi Truong
(74) *Attorney, Agent, or Firm* — Foley & Lardner LLP

(57) ABSTRACT

An emulation processor may be configured to support emulating unknown binary logic based on non-arbitrariness of the unknown binary logic. For example, an unknown binary logic signal may take the finite binary values of 0 and 1. The circuitry in the emulation processor is configured to generate and propagate outputs based on the interactions of known input binary signals with the unknown input binary signals having non-arbitrary states. The emulation processor may support the both combinational and sequential operations associated with the unknown binary logic.

18 Claims, 16 Drawing Sheets

(56) References Cited

U.S. PATENT DOCUMENTS

2016/0217236 A1* 7/2016 Rabinovitch ......... G06F 30/331
2017/0141914 A1* 5/2017 Satpathy ............... H04L 9/0643

OTHER PUBLICATIONS

Mahdi Aminian, FPGA-Based Circuit Model Emulation of Quantum Algorithms. (Year: 2008).*
Subhasish Mitra, X-Compact: An Efficient Response Compaction Technique (Year: 2004).*
Oscar Ballan, Verification of soft error detection mechanism through fault injection on hardware emulation platform. (Year: 2010).*
Hima Bindu, ASIC Design Flow Tutorial Using Synopsys Tools. (Year: 2009).*
Yan-Li Hou, Initialization for Synchronous Sequential Circuits Based on Chaotic Particle Swarm Optimization. (Year: 2010).*
Ch Lakshmikantam, VMS: A VHDL Modeling System. (Year: 1994).*

* cited by examiner

100

200

| rst | clk | Q (RTL mode) | Q (CAT Mode) | Q (FOX Mode) |
|---|---|---|---|---|
| 0 | 0→1 | D* | D* | D* |
| 1 | 0→1 | 0 | 0 | 0 |
| X | 0→1 | D* | Xresolve(0,D*) | X |
| 0 | 0→X or X→1 | D* | Xresolve(D*,Q*) | X |
| 1 | 0→X or X→1 | 0 | Xresolve(0,Q*) | X |
| X | 0→X or X→1 | D* | Xresolve(0,D*,Q*) | X |

EMULATION SYSTEM SUPPORTING REPRESENTATION OF FOUR-STATE SIGNALS

TECHNICAL FIELD

This application is generally directed towards emulation systems and more specifically towards emulation processors supporting representation of four state signals.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs.

A significant function of EDA tools is emulation of a user logical system (e.g., an IC design) to perform pre-silicon functional verification, firmware and software development, and post-silicon debug. To achieve this, a typical processor-based emulation system comprises several Application Specific Integrated Circuits (ASICs) all working together to execute a program generated by an emulation compiler generated from the user's IC design. The compiled program models a design under test (DUT) that is a logical representation of the user's IC design running on the emulation system.

Conventional emulation systems are limited to supporting two-state known logic. More specifically, the logic signals computed, detected, and stored within conventional emulation are either "0" or "1." The limitation restricts the logic verification functionality of the conventional emulation systems because parts of an IC should be able to propagate unknown logic signals without malfunctioning or treating an unknown logic signal as a known logic signal. In other words, when a design corresponding to the IC is being emulated as a DUT conventional emulation systems, unknown logic signals cannot be tagged and treated differently. For example, conventional emulation systems cannot propagate unknown logic outputs to a downstream logic in response to receiving an unknown logic input from an upstream logic. The unknown logic signals are treated as known logic signals, which may trigger unintended operations within the DUT or the failure to detect incorrect design behavior. For example, if a first logic input to an AND gate is 1 and the second logic input is an unknown logic, which could either be 0 or 1. The output of the AND gate in the conventional emulation system will be 1 if the unknown logic is 1 and 0 if the unknown logic is 0. The conventional emulation system then may treat the output of the AND gate as a known logic. However, the output of the AND gate should be unknown because of an unknown input. By contrast, conventional logic simulators may fully support multi-valued signals, in particular unknown ("X") and undriven ("Z"). While emulation has conventionally supported correct modeling on a limited set of multi-driven tri-state signals, this support has not extended to propagation forward through logic gates due to impractical cost overhead through reduced system capacity.

As such, there is a significant technological gap in conventional emulation systems that requires a significant improvement.

SUMMARY

What is therefore desired are emulation systems and methods supporting three or four state logic including both known and unknown logic states. What is further desired are emulation systems supporting three or four state logic during emulation of both combinational and sequential (or synchronous) circuits.

Embodiments disclosed herein attempt to solve the aforementioned technical problems and may provide other benefits as well. An emulation processor may be configured to support emulating unknown binary logic (e.g., X state) based on non-arbitrariness of the unknown binary logic. For example, an unknown binary logic signal may take the finite binary values of 0 and 1. The circuitry in the emulation processor is configured to generate and propagate outputs based on the interactions of known input binary signals with the unknown input binary signals having non-arbitrary states. The emulation processor may support the both combinational and sequential operations associated with the unknown binary logic.

In one embodiment, a logic emulation system comprises at least one processor having: a hardware component and a plurality of inputs, the processor configured to emulate a circuit design by using the hardware component and any of the plurality of inputs to model a circuit that operates with an unknown logic state.

In another embodiment, an emulation method comprises receiving, by a hardware component of a processor, a plurality of inputs; and emulating, by the processor, a circuit design by using the hardware component and any of the plurality of inputs to model a circuit that operates with an unknown logic state.

BRIEF DESCRIPTION OF THE DRAWINGS

The accompanying drawings constitute a part of this specification and illustrate an embodiment of the subject matter described herein.

FIG. 15 shows another table with illustrative outputs of a circuit of a processor in an emulation system supporting unknown logic states of synchronous circuits, according to an embodiment.

DETAILED DESCRIPTION

Figure 1:
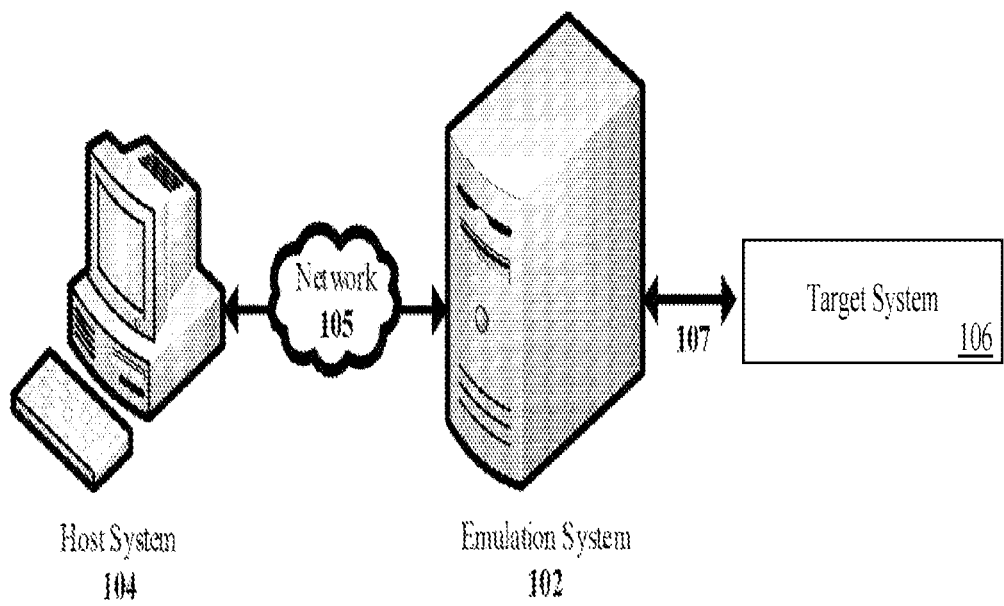
FIG. 1 shows an illustrative environment including an emulation system, according to an embodiment.

The illustrative methods and systems described herein can emulate three or four logic values. The four logic values are (i) known logic value 0, (ii) known logic value 1, (iii) an unknown logic value X that could either be 0 or 1, and (iv) a high impedance logic value Z that may indicate an open circuit. As the behavior of a circuit may be the same for unknown logic value X and the high impedance value Z, an emulation processor may model and emulate X and Z in the same way when they drive inputs to logic gates. It should therefore be understood that the description below of an unknown logic value X also applies to the high impedance value Z. Alternatively, it can be understood that X may refer to either X or Z. Furthermore, in the description below, both known and unknown logic values may be referred to a logic signals or logic states. Furthermore, the emulation processor is to be understood to be any computational unit configured to perform logic computation for the purpose of emulation, simulation, or prototyping of logic systems. The emulation processor may include Boolean-processor-based system, a field programmable gate array (FPGA), or the like.

Rather than treating the four states (1, 0, X, and Z) with a quaternary logic function or three states (1, 0, and X (including Z)) as a ternary logic function, an emulation processor leverages the logic state of an unknown logic X to treat the unknown logic X as the unknown value it is intended to represent among the set of two binary logic states. This use of three states is possible because the unknown logic X is not an arbitrary logic, but assumes one of the two binary states in the real circuit. X may be a useful representation in a simulation or emulation to account for certain indeterminate situations such as an unknown value before initialization, due to powered-down components, or resulting from timing violations. Lookup tables in the emulation processor may be implemented as multiplexers with the selectors configured to select one input of multiple inputs as an output. The emulation processor may use a cascade of multiplexers to model and emulate more complex lookup tables. The emulation processor may leverage the non-arbitrariness of the behavior of logic gates with respect to unknown inputs to derive the correct behavior of these gates in the presence of the unknown logic X by augmenting the behavior of these multiplexers to model the unknown logic X.

For example, the emulation processor may model an unknown logic X as a selector for a 2-to-1 multiplexer. If the inputs to the multiplexer are equal, then the output is known even though the selector is unknown because selector being non-arbitrary will select between two equal inputs. However, if the inputs to the multiplexer are not equal, the output is unknown because the selector is unknown. As another example, one of the two inputs to the 2-to-1 multiplexer may be unknown and the selector may be known. If the known selector selects the known input, then the output is known. However, if the known selector selects the unknown input, the output is unknown. In both these cases, the behavior of the logic gate in the presence of unknown values may be inferred from the behavior of the binary gate being modeled within any additional configuration.

The emulation processor described herein comprises hardware circuit based on the principle of the non-arbitrariness of the unknown logic X to model, emulate, and propagate the unknown logic X correctly. In addition to emulating the unknown logic X in combinational logic as described above, the emulation processor may emulate the unknown logic X in synchronous logic as well. More particularly, the emulation processor may emulate flops with both synchronous and asynchronous resets for unknown reset and clock signals. By using a combinational logic, a multiplexer, a selector to the multiplexer to select between different combinations, the emulation processor emulates the operation of a flop for unknown reset and clock signals. The emulation processor may emulate the operation of the flop for different modes such as: (i) "register transfer level" (RTL) mode where the emulation processor emulates the behavior of the flop it is programmed in the hardware description language by not taking the positive branch when a condition is X, (ii) a "computer as ternary" (CAT) mode where the emulator emulates an actual hardware behavior of the flop, and (iii) a "forward only X" (FOX) mode where the emulation processor pessimistically emulates the behavior of the flop by generating an unknown output for any unknown input. These are known modes for modeling the behavior of state elements in the presence of unknown values that can be selected within simulations depending upon the level of congruence or X-pessimism a user desires.

FIG. 1 shows an illustrative environment 100 of an emulation system supporting representation of four-state signals, according to an embodiment. The illustrative environment 100 may comprise a host system 104, an emulation system 102, a target system 106, a network 105, and a connection 107. The host system 104 may include one or more workstations that may run debug and runtime software that may interact with the emulation system 102. The host system 104 may include workstations that may be any type of computing devices such as a desktop computers, laptop computers, tablet computers, and smartphones. The emulation system 102 may a combination of hardware and software modules which may emulate a design under test (DUT). As described below, the emulation system 102 may include clusters of interconnected ASICs, non-transitory memory devices, buffers, data storage devices configured to provide a system platform for emulating the DUT. The clusters may be arranged in multiple boards. The boards may be arranged within multiple racks. Multiple racks may be arranged in a plurality of emulation of devices, which may be analogous to multirack servers. The target system 106 may comprise hardware and/or software modules configured to interact with the DUT being emulated. For example, if the DUT is a design of a graphics processing unit (GPU), the target system 106 may be analogous to a motherboard configured to receive the GPU after fabrication. In other words, the target system 106 may be an external hardware environment provided by the user.

The network 105 may be any kind of communication link facilitating communication between the host system 104 and the emulation system 102. For example, the network 105 may a local area network may include a local area network (LAN), metropolitan area network (MAN), wide area network (WAN), and/or the Internet. The connection 107 may be also be any kind of communication link configured to facilitate a communication with the emulation system 102 and the target system 106.

It should be understood that the above described systems 102, 104, 106 of the environment 100 are merely illustrative and other configuration should be considered to be within the scope of this disclosure. For example, the network 105 may include a local connection 107 or a combination of multiple local interconnects. In some embodiments, the systems 102, 104, 106 may be local and housed within the same building. In other embodiments, one or more of the systems 102, 104, 106 may be accessed remotely. For example, the host system 104 may remotely access the emulation system 102 through the network 104 using a remote access protocol such as internet protocol (IP).

Figure 2:
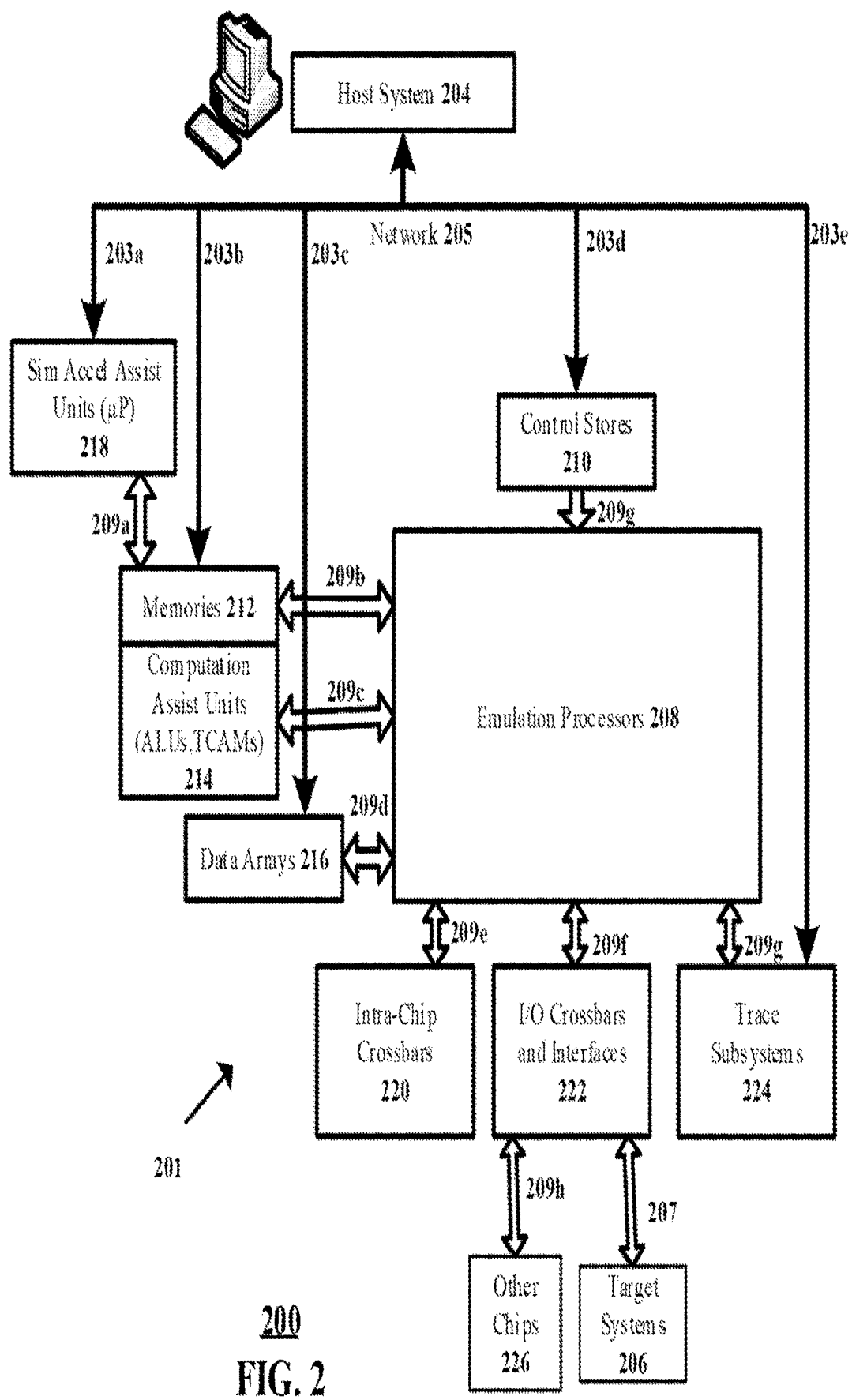
FIG. 2 shows another illustrative environment including an emulation processor, according to an embodiment.

FIG. 2 shows a more detailed view of the illustrative environment 200, particularly showing the components within an ASIC 201 of an emulation system (such as the emulation system 102 in FIG. 1). As shown, the ASIC 201 may comprise emulation processors 208, control stores 210, memories 212, computation assist units 214, data arrays 216, simulation acceleration assist units 218, intra-chip crossbar 220, input/output crossbars and interfaces 222, and trace subsystems 224. As shown, these components may be connected using the interconnects 209a-209h. Furthermore, a network 205 (similar to the network 105 in FIG. 1) connecting the host system 204 (similar to the host system 104 in FIG. 1) with the ASIC 201 may include interconnects 203a-203e.

Each ASIC in the emulation system may contain a large number of emulation processors 208 (also referred to as Boolean processors). An emulation processor of the emulation processors 208 may be any computational unit configured to perform logic computation for the purpose of emulation, simulation, or prototyping of logic systems. The emulation processors 208 may include Boolean-processor-based systems, FPGAs, or the like. The emulation processors 208 may retrieve a program containing instructions from the control store 210 and execute the program for one or more emulation cycles. For a DUT, the program may be the same for different emulation cycles, and the data on which the program operates may change because of the change in the states of the DUT from one cycle to another. These states, representing the state of the DUT's state elements, intermediate combinational nodes, and states of design memories are stored by a cluster of emulation processors 208 (typically a cluster of 8 emulation processors 208) into data arrays 216. In some embodiment, the cluster of emulation processors 208 may store the states into other larger memories 212 that may comprise internal memory (INTRAM) and external memory (EXTRAM).

The ASIC 201 may further comprise computation assist units 214 that the ASIC 201 may use to model functions that may not be efficiently handled by general-purpose bitwise processors and generic memories. The computation assist units 214 may include hardware structures to perform arithmetic operations (ALUs) and to emulate ternary content-addressable memories (TCAMs). The ASIC 201 may also comprise simulation acceleration assistance units 218, which may be embedded microprocessors that may provide a capability for local processing of simulation acceleration or analysis tasks. The local processing of simulation acceleration unit may be implemented along with any other simulation acceleration at the host workstation 204.

The intra-chip crossbars 202 may provide an interface for the emulation processors 208 to interact with the other processors in other ASICs (not shown). The input/output (I/O) crossbars and interfaces 222 may provide an interface for the ASIC 201 to interact with the target systems 206 (similar to the target system 106 in FIG. 1) or other external chips 226. The target systems 206 and the external chips 226 may provide an external hardware environment for the DUT being emulated by the emulation system. The target systems 206 may be connected to the ASIC 201 using a connection 207 (similar to the connection 107 in FIG. 1). The trace subsystems 224 may collect and/or store signals generated in the ASIC 201 (or the emulation system in general) during the execution of the DUT. The trace subsystems 224 may function in concert with compiler and runtime or offline debug code to collect and store the signals. The trace subsystems 224 may support two general modes of operations: (i) dynamic probes, which may allow a set of user-specified probes with deep traces; and (ii) full vision, which may allow reconstruction of all user signals without user specification and without performance impact.

Figure 3:
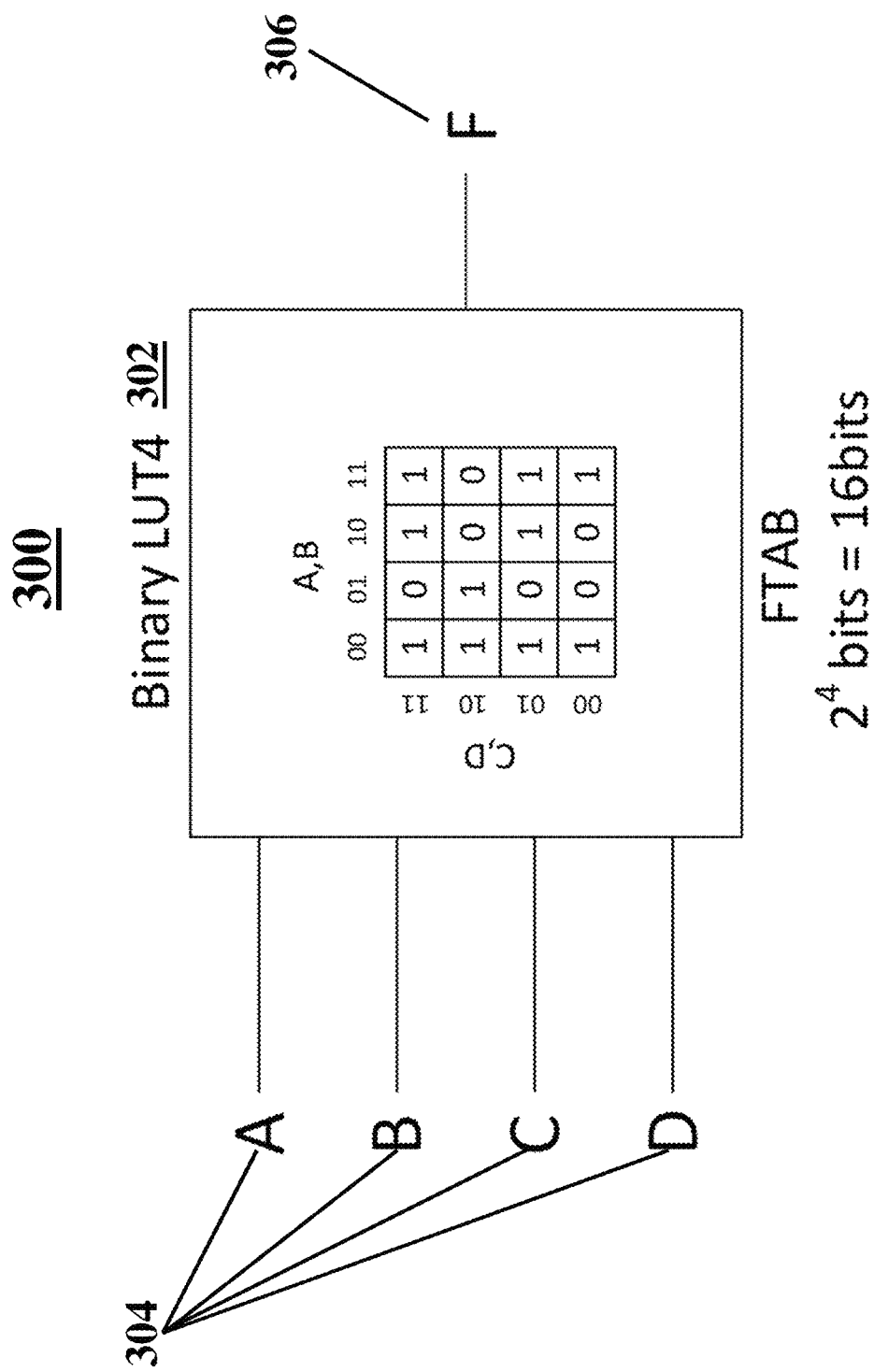
FIG. 3 shows an illustrative functional block diagram of a binary four-input lookup table (LUT4) of a processor of an emulation system, according to an embodiment.

FIG. 3 shows an illustrative functional block diagram of a binary four-input lookup table (LUT4) 302 in an emulation processor 300 to model computation over four known input states. The LUT4 302 is a programmable element configurable to provide a logical function, for example, binary outputs based upon the binary inputs. In particular, the LUT4 302 is configurable to produce the sixteen possible logical outputs for Boolean operations of the four variables. The LUT4 302 is designed using other programmable systems for performing and/or functionality, such as logic gates, flip-flops, multiplexers, and programmable AND-OR arrays. In some embodiments, the LUT4 302 may be implemented using a random access memory. More specifically, the LUT4 302 is implemented using a 16-bit RAM. In some embodiments, each bit stores an output state corresponding to possible input combinations (e.g., 16 possible input combinations). In further embodiments, the LUT4 302 may be implemented using other types of memories besides a RAM, such as individual state elements, a first-in/first-out (FIFO) memory or content-addressable memory (CAM), or a combination of these. In some embodiments, the LUT4 302 may be implemented with a multiplexer whose select lines are driven by an address signal and whose input values may be elements contained in an array.

As described above, each of the four inputs in the LUT4 302 are known (represented by 0 or 1). The LUT4 302 may further include an instruction memory, instruction decoder, a data array memory, and path multiplexers. The instruction memory, the instruction decoder, and the data array memory may correspond to one or more portions of a larger instruction memory, decoder and/or data array memory, respectively.

As described above, the LUT4 302 may be implemented with a multiplexer configured to execute any Boolean function that has a same number of inputs 304 as a number of select inputs of the multiplexer and to output a bit result (known as a function bit out) as an output 306. For example, a four-way multiplexer has two select inputs and four data inputs 304. By varying the values of the data inputs 304, any two-bit Boolean function can be emulated using the multiplexer. A processor cluster may use the LUT4 302 for each emulation processor 300 in accordance with the disclosed embodiments. Accordingly, the LUT4 302 can perform any four-bit Boolean function as the basis of its emulation processor 300. The LUT4 302 may evaluate data received from the data array memory using a control store word supplied from the instruction memory to produce the output 306. The resulting LUT4 302 output 306 may correspond to a logic gate output of the emulated design, a register output of the emulated design, a synthesized intermediate logic state, or a control bit generated for the emulation process.

The instruction memory may contain the instructions (e.g., control store words) for the LUT4 302 in the emulation processor 300, which are passed to the LUT4 302 from the decoder as LUT inputs. The emulation of a logic design may be achieved by repeatedly running a set of the instructions. Each pass through the instruction memory (e.g., a cycle) results in the equivalent number of LUT operations. Using the depth of the instruction memory and multiplying this by a size of the lookup table (e.g., a LUT4 302) results 306 in the overall capacity of the emulation system. Accordingly, if the instruction memory has eight locations, one cycle would result in emulation processor 300 executing eight lookup table operations. The data array memory may store the results of lookup table evaluations (the output 306) during emulation.

Figure 4:
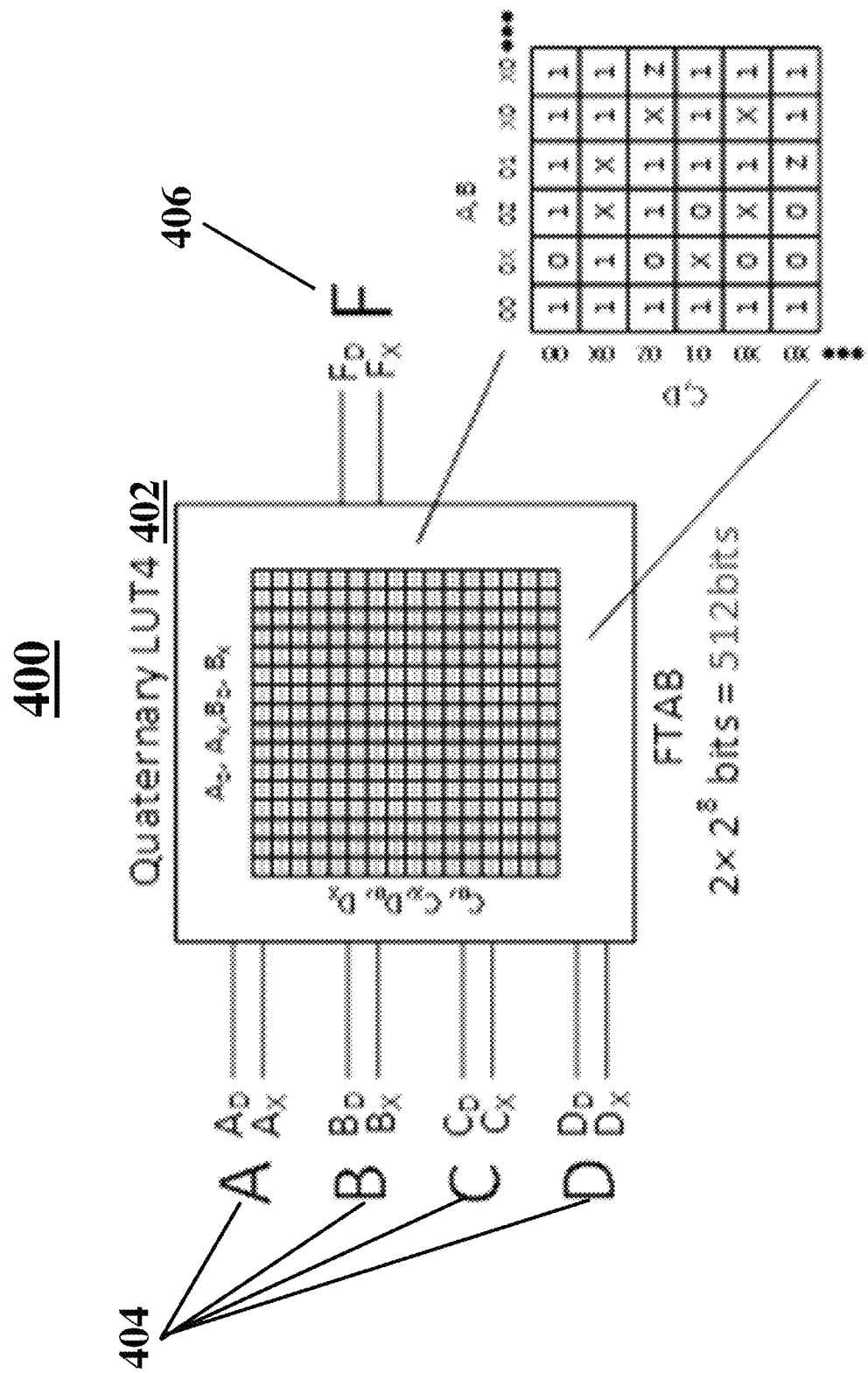
FIG. 4 shows an illustrative functional block diagram of a quaternary four-input lookup table (LUT4) of a processor of an emulation system, according to an embodiment.

FIG. 4 shows a functional block diagram of a quaternary four-input lookup table (LUT4) 402 of an emulation processor 400. The emulation processor 400 may include a quaternary LUT4 402, an instruction memory, instruction decoder, a data array memory, and path multiplexers. The instruction memory, the instruction decoder, and the data array memory may correspond to one or more portions of a larger instruction memory, decoder and/or data array memory, respectively. Each of the four inputs to the quaternary LUT4 402 as well as the output of the LUT is represented with 2 bits, which is equal to one quaternary digit, that is, 0→00, 1→01, X→10, Z→11. It should be understood that alternative logic and number of bits may be utilized.

The quaternary LUT4 402 is a multiplexer that can execute any combinational function that has a same number of inputs 404 as a number of select inputs of the multiplexer and output a bit result as an output 406. For example, a four-way multiplexer has two select inputs and four data inputs 404. By varying the values of the data inputs 404, and the stored lookup table, any four-input combinational function can be emulated using the multiplexer. A processor cluster may use the quaternary LUT4 402 for each emulation processor 400 in accordance with the disclosed embodiments. Accordingly, the quaternary LUT4 402 can perform any four-bit combinational function as the basis of its emulation processor 400 or can evaluate any desired four-state output as a results of any combination of four-state inputs. The quaternary LUT4 402 may evaluate data received from the data array memory using a control store word supplied from the instruction memory to produce the output 406. The resulting output 406 may correspond to a logic gate output of the emulated design, a register output of the emulated design, a synthesized intermediate logic state, or a control bit generated for the emulation process.

The instruction memory may contain the instructions (e.g., control store words) for the quaternary LUT4 402 in the processor cluster, which are passed to the quaternary LUT4 402 from the decoder as LUT inputs. The emulation of a logic design may be achieved by repeatedly running a set of the instructions. Each pass through the instruction memory (e.g., a cycle) results in an equivalent number of LUT operations. Using the depth of the instruction memory and multiplying this by a size of the lookup table (e.g., a 4-input LUT) results 406 in an overall capacity of the emulation system. Accordingly, if the instruction memory has eight locations, one cycle would result in emulation processor executing eight lookup table operations. The data array memory may store the results of lookup table evaluations (the output 406) during emulation.

It should be understood that FIG. 4 shows the complexity in modeling four state signals (0, 1, X, and Z) using 2 bits. In particular, to model four logic states without further optimizations, the quaternary lookup table 402 may utilize a significant amount of memory of 512 bits (versus only 16 bits for binary-only support). The four state (or value) modeling shown in FIG. 5 can be reduced to a three state modeling with X incorporating both X and Z. However, as described below, the three value modeling also incurs a significant amount of memory (272 bits).

Figure 5:
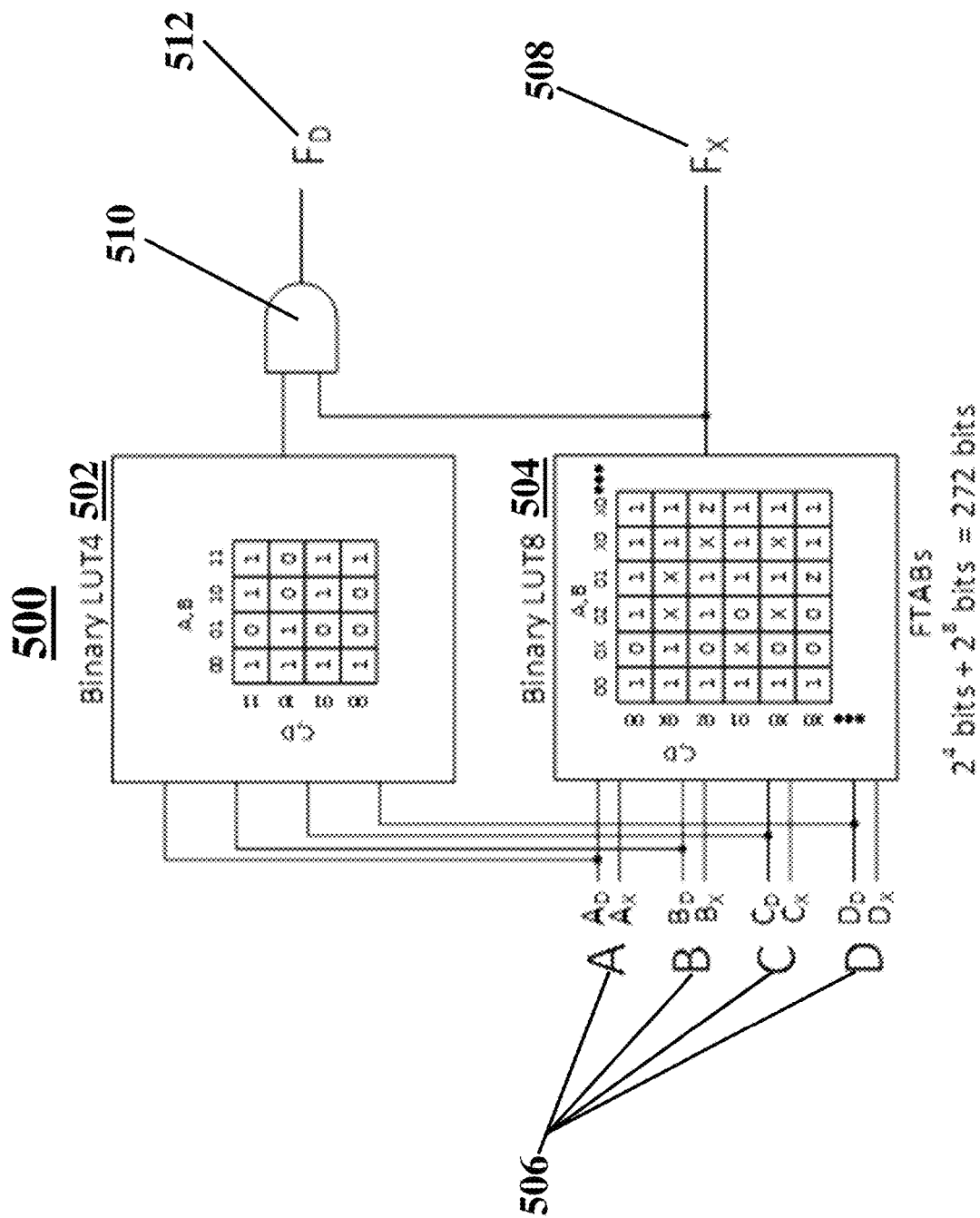
FIG. 5 shows an illustrative functional block diagram of a binary four-input lookup table (LUT4) and a binary eight-input lookup table (LUT8) of a processor of an emulation system, according to an embodiment.

FIG. 5 shows a functional block diagram of a binary four-input lookup table (LUT4) 502 and a binary eight-input lookup table (LUT8) 504 of a processor 500. The processor 500 may include a binary LUT4 502, a binary LUT8 504, an instruction memory, instruction decoder, a data array memory, and path multiplexers. The instruction memory, the instruction decoder, and the data array memory may correspond to one or more portions of a larger instruction memory, decoder and/or data array memory, respectively. Each of the four inputs to the binary LUT4 502 are known, and represented by 0 or 1. Each of the four inputs to the binary LUT8 504 is represented with 2 bits, which is equal to one quaternary digit, that is, 0→00, 1→01, X→10, Z→11. This simplification takes advantage of the fact that X and Z can be considered equivalent with respect to treatment in logic systems given that Z values can be modeled independently of logic gate evaluation.

The binary LUT4 502 is a multiplexer that can execute any combinational function that has a same number of inputs 506 as a number of select inputs of the multiplexer and output a bit result as the binary LUT8 504 output 508. For example, a four-way multiplexer has two select inputs and four multi-valued data inputs 506 where each of the four data inputs 506 is represented with two bits. By varying the values of the data inputs 506, any combinational function can be emulated using the multiplexer. A processor cluster may use binary LUT8 504 for each processor 500 in accordance with the disclosed embodiments. Accordingly, the binary LUT8 504 can perform any eight-bit combinational function as the basis of its processor 500. This output may represent whether the overall output should represent a known (0/1) or an unknown (X/Z) value. The binary LUT8 504 may evaluate data received from the data array memory using a control store word supplied from the instruction memory to produce the LUT8 processor output 508. The binary LUT8 504 output 508 may correspond to a logic gate output of the emulated design, a register output of the emulated design, a synthesized intermediate logic state, or a control bit generated for the emulation process.

The binary LUT4 502 is a multiplexer that can execute any combinational function that has a same number of inputs 506 as a number of select inputs of the multiplexer and output a bit result known as a function bit out. This output may represent which known value (0/1) should be output in the case that the overall function should return a known value. The output of this LUT4 is sent as an input to an AND gate 510 along with binary LUT8 504 output 508 will generate a binary LUT4 502 output 512. In this circuit, the AND gate may canonicalize the output to X when the LUT8 determines the output should represent an unknown value. The four-way multiplexer may have two select inputs and four data inputs 506. By varying the values of the data inputs 506, any two-bit combinational function can be emulated using the multiplexer. A processor cluster may use the binary LUT4 502 for each processor 500 in accordance with the disclosed embodiments. Accordingly, the binary LUT4 502 can perform any four-bit combinational function as the basis of its processor 500. The binary LUT4 502 may evaluate data received from the data array memory using a control store word supplied from the instruction memory to produce the output, which when sent as an input to the AND gate 510 along with the binary LUT8 504 output 508 will generate the binary LUT4 502 output 512. The binary LUT4 502 output 512 may correspond to a logic gate output of the emulated design, a register output of the emulated design, a synthesized intermediate logic state, or a control bit generated for the emulation process. The combination of binary output signals 508 and 512 ($F_X$ and $F_D$) together represent the multi-valued output of the emulated gate from among the values 0, 1 and X.

The instruction memory may contain the instructions (e.g., control store words) for the binary LUT4 502 and the binary LUT8 504 in the processor cluster, which are passed to the binary LUT4 502 and the binary LUT8 504 from the decoder as LUT inputs. The emulation of a logic design may be achieved by repeatedly running a set of the instructions. Each pass through the instruction memory (e.g., a cycle) results in a number of LUT operations. The data array memory may store the results of lookup table evaluations (the output) during emulation.

Therefore, without further optimization, the three state modeling shown in FIG. 5 includes 272 bits of memory and one AND gate. The memory consumption increases significantly for larger functions. The description below details a more optimized circuitry for modeling and emulating four state logic.

Figure 6:
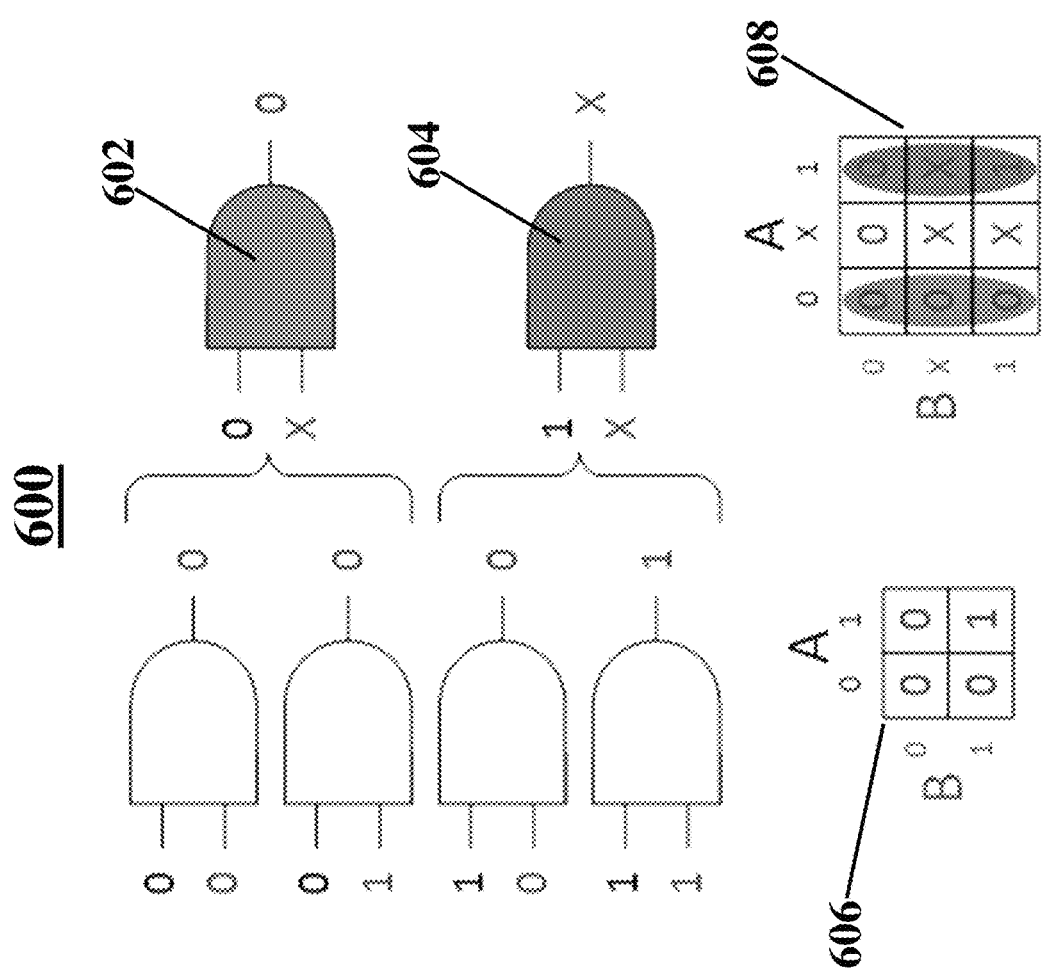
FIG. 6 shows various illustrative ternary logic functions, according to an embodiment.

FIG. 6 shows various ternary logic functions 600 of an emulation system. A function of a ternary logic on (0, X, 1) is not an arbitrary function of ternary inputs because the unknown state X may only have two non-arbitrary states 0 and 1. The function of a ternary logic on (0, X, 1) follows directly from the properties of an original (binary) logic gate. For instance, an AND gate is a digital logic gate with two or more inputs and one output that performs logical conjunction. The output of an AND gate is true (1) only when all of the inputs are true (1). If one or more of an AND gate's inputs are false (0), then the output of the AND gate is false (0). In other words for a logic AND gate, any low or false (0) input will give a low or false (0) output.

As shown in FIG. 6, a first AND gate 602 is a digital logic gate with two inputs and one output that performs logical conjunction. The first input has a definite value, which is 0. The second input is unknown (X), and may be 0 or 1. With said inputs, the output of the first AND gate 602 is always low or false (0) because no matter what is the value of the second input X, since the first input to the first AND gate 602 is false (0), then the output of the first AND gate 602 is always going to be false (0).

A second AND gate 604 is a digital logic gate with two inputs and one output that performs logical conjunction. The first input has a definite value, which is 1. The second input is unknown (X), and may be 0 or 1. With said inputs, the output of the second AND gate 604 will always be X. In one instance, when the value of X is false (0), in such a condition, the output of the second AND gate 604 will be false (0) since one of the inputs is false (0) and another input is true (1). In another instance, when the value of X is true (1), in such a condition, the output of the second AND gate 604 will be true (1) since now both the inputs are true (1).

A first truth table 606 is a logically-based mathematical table used in connection with Boolean functions, which sets out the functional values of logical expressions on each of their functional arguments, that is, for each combination of values taken by their logical variables. The first truth table 606 illustrates the possible outcomes of a scenario when there are two known inputs (0 and 1) to first the AND gate 602. The first truth table 606 contains the truth values that would occur under the premises of a given scenario.

A second truth table 608 is a logically-based mathematical table used in connection with combinational functions, which sets out the functional values of logical expressions on each of their functional arguments, that is, for each combination of values taken by their logical variables. The second truth table 608 illustrates the possible outcomes of a scenario when an AND gate such as 602 or 604 is driven by any combination of known and unknown values (0, 1, X, and Z). More particularly, the second AND gate 608 shows the output is 0 if one of the inputs is 0, regardless of whether the other input is known or unknown. However, the output is unknown if one of the inputs is 1 and the other input is unknown.

Figure 7:
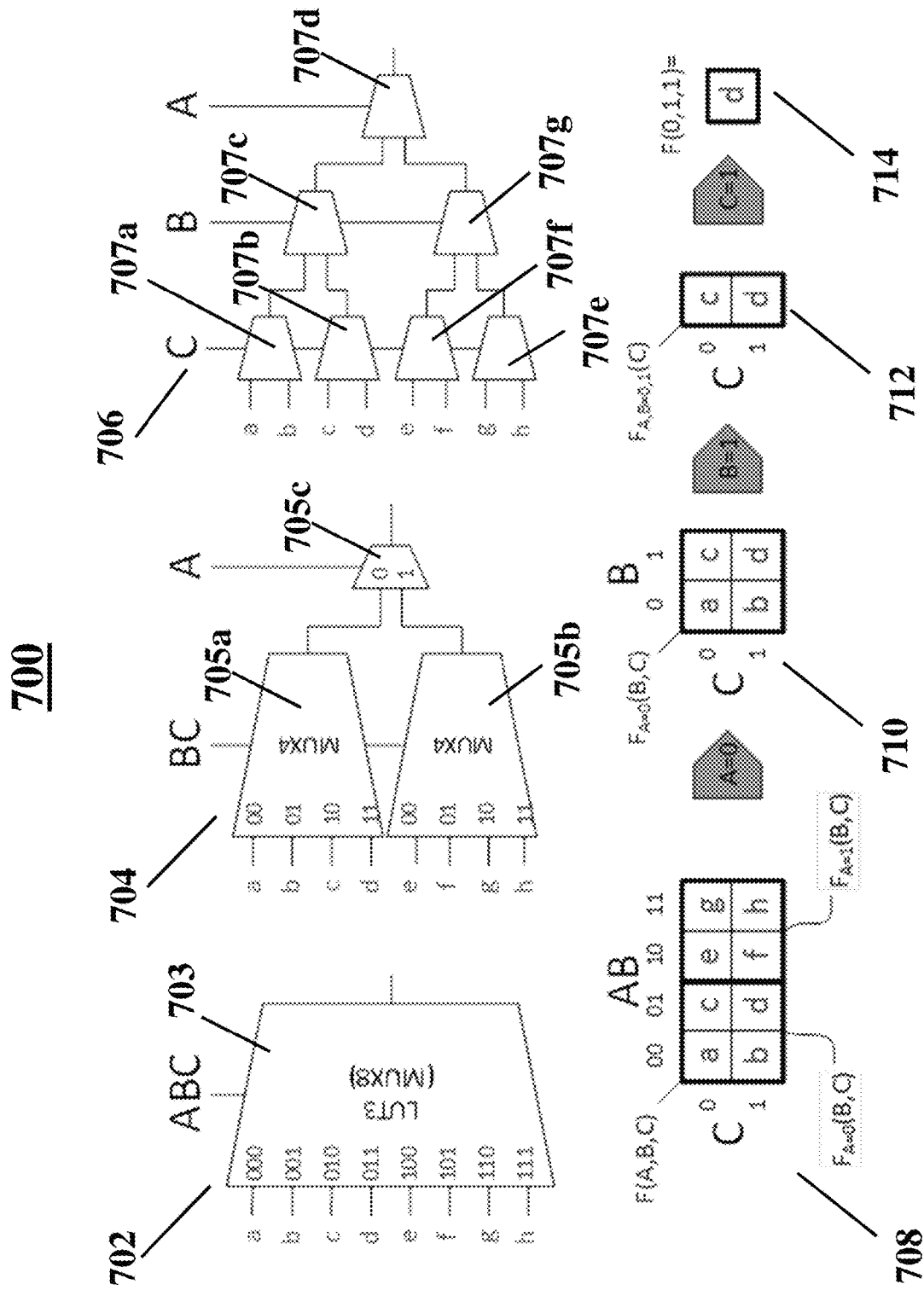
FIG. 7 shows various illustrative electronic circuits supporting functional decomposition in a processor of an emulation system, according to an embodiment.

FIG. 7 shows various electronic circuits 700 of an emulation system allowing an emulation of any function that could be produced by a logic system (e.g., ASIC, CPU, GPU, ALU) currently being emulated. The electronic circuits contain a first electronic circuit 702, a second electronic circuit 704, and a third electronic circuit 706. All of the circuits 702, 704, 706 are functionally equivalent and are presented to illustrate how decomposition of logical functions is congruent to decomposition of lookup tables that are capable of emulation those functions, as described below.

FIG. 7 shows an illustration 700 of a Boolean decomposition of a function and the corresponding arrangement of multiplexers to emulate the function in an emulation processor. The Boolean function to be decomposed may be a three input function F(A, B, C), where three inputs are A, B, and C. An emulation processor may use an 8-to-1 circuit 702 comprising a single multiplexer 703 to emulate the three input function F(A, B, C). A truth table 708 corresponds to the output of the multiplexer 703. More particularly, the emulation processor uses the three inputs A, B, and C as three bit selectors to the multiplexer to select from the inputs a-h of the multiplexer 703.

Decomposing the operations of the operation of the multiplexer 703 in the circuit 702, the emulation processor may implement cascading multiplexers in the circuit 704. In particular, the circuit 704 includes two multiplexers 705a, 705b with a two bit selector having inputs B and C. Another multiplexer 705c downstream of the multiplexers 705a, 705b uses the input A as a selector between the outputs of the multiplexers 705a, 705b. In other words, separating the input A cuts the possible combinations of A, B, and C by half. More particularly, A, B, and C have eight possible combinations ($2^3$) but B and C have four possible combinations ($2^2$) when the value of A is given. For example, truth table 710 shows the outputs when A=0 showing the operation circuit 704 when the selector line A selects the input line 0 of the multiplexer 705c.

The operations of the multiplexers 705a, 705b, 705c may further be decomposed into seven 2-to-1 multiplexers 707a-707g as shown in the circuit 706. As further depicted in the circuit, there multiplexers 707a-707g can be arranged in a cascading pattern with a first group of multiplexers 707a, 707b, 707f, 707e upstream to a second group of multiplexers 707c, 7074g that is in turn upstream to a multiplexer 707d. The first group of multiplexers 707a, 707b, 707f, 707e have input C as a selector, the second group of multiplexers 707c, 7074g have input B as a selector, and third multiplexer 707d have A as a selector. Grouping the multiplexers in a cascade pattern where each cascade uses one bit of the input as a selector allows the emulation processor to halve the operation in each group. For example, truth table 712 shows the outputs based upon the value of C when A=0 and B=1. The truth table therefore describes the behavior of the multiplexers 707b in the circuit 706. Because A=0 selected the multiplexers 707a, 707b, 707c and B=1 further narrowed down the selection to the multiplexer 707b, the emulation processor now observes the output of a single multiplexer. Truth table 714 shows the output of the multiplexer 707b when C=1. Therefore, based upon the operations in the circuit 706, the emulation processor evaluated F(A, B, C) for A=0, B=1, and C=1.

It should be understood that the aforementioned process of successively halving the size of the lookup table after considering each input is congruent to the process for cascading through the multiplexers illustrated in the circuit 706. From this, as detailed below in FIG. 8 and FIG. 9 the correct behavior of the emulated circuit in the presence of unknown (X) values may be derived from the original Boolean (binary) functional table.

Figure 8:
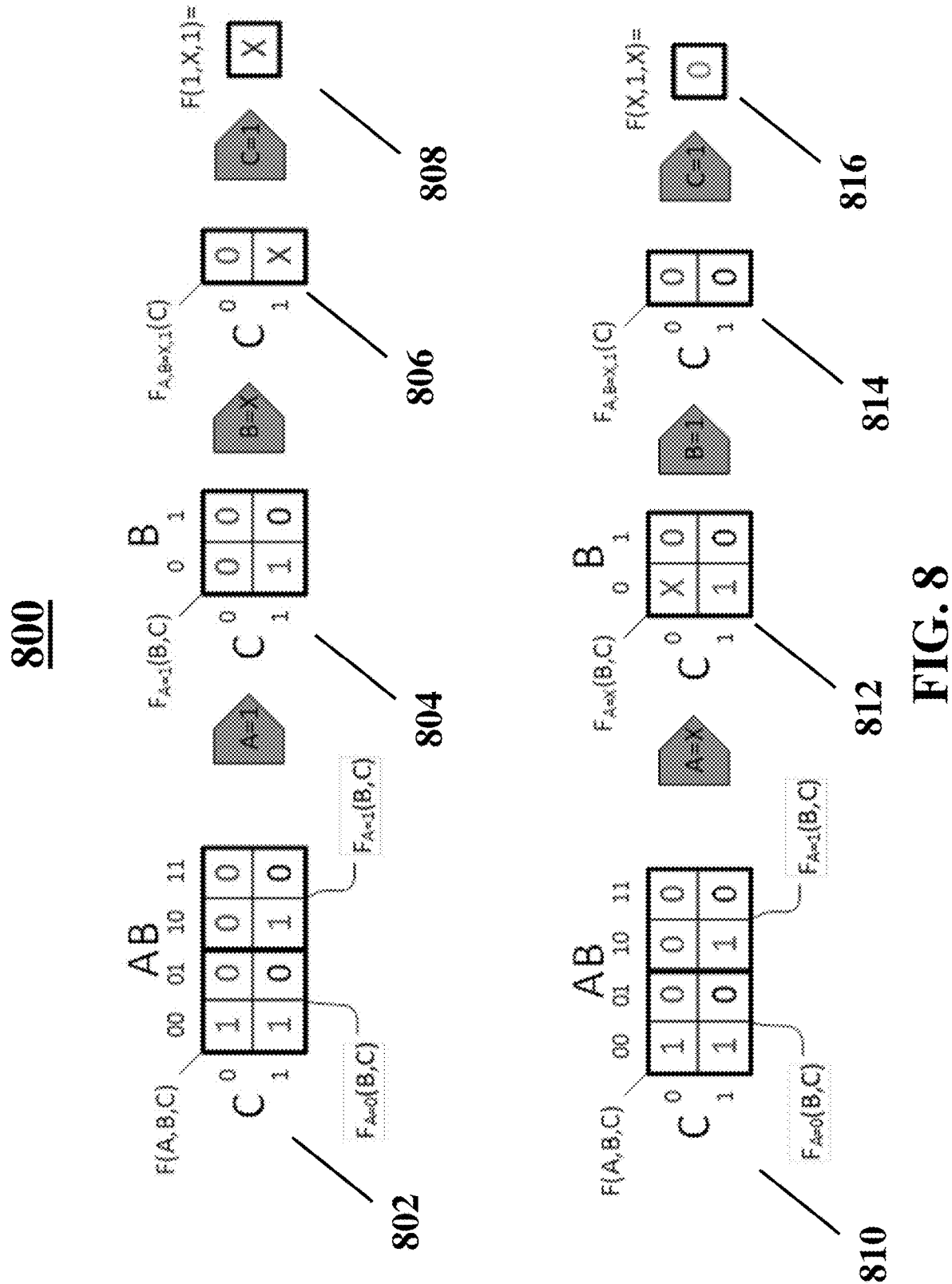
FIG. 8 shows various illustrative truth tables for implementing unknown logic states in a processor of an emulation system, according to an embodiment.

FIG. 8 shows various truth tables 800 when the operation described in FIG. 7 is extended to the conditions when A=1, C=1, and B is unknown (B=X) (truth tables 802, 804, 806, 808) and to the conditions when A is unknown (A=X) and B=1 and C=1 (truth tables 810, 812, 814, 816). Each successive halving of the table here can be derived by examining the one input under consideration. When the input is 0 or 1, the correct entry from either half of the table is taken. When the input is X, then the result takes of the corresponding value from the two halves of the table if they match, and if they do not match, the new value is X. Truth table 802 shows the outputs for all three inputs A, B, C. For A=1, truth table 804 shows the outputs for the combinations of the inputs B and C, wherein the right-hand half of table 802 was selected. As seen in truth table 804, the value of the combination of B and C=0 ($F_{A=1}(B,C=0)$) is 0 regardless of the value of B. However, the combination of B and C=1 ($F_{A=1}(B,C=1)$) depends upon the value of B. Therefore if B is unknown and C is 0, the output should be known. However, if B is unknown and C is 1, the output should be unknown. In other words, the left and the right halves of table 804 are merged to produce table 806 in such a way that when the table entries match between the halves, the new table contains the matching value, and when the two halves do not match the new table contains X. Truth table 806 shows the aforementioned result. Table 808 shows the final result when C=1, which based on the above calculation should be unknown. In this case, because C=1 causes the selection of the lower half of table 806, whose value is X.

Truth table 810 shows the outputs for all three inputs A, B, C. For A=X, truth table 812 shows the outputs for the combinations of the inputs B and C. As seen in the truth table 810, for B=1 the output is always 0 regardless the value of A or C. For C=1, the output is 1 when B=0 and the output is 0 when B=1, regardless the value of A. These condition is shown in the truth table 812 with known outputs even when A is unknown. However, the output of B=0 and C=0 depends upon the value of A the result is unknown when A is unknown. Equivalently, table 812 from table 810 may be derived in the case where A=X by combining the left and the right halves of table 810 as described earlier: the value taken is the matching value when it matches between the two halves, otherwise it is X. Truth table 814 shows the output when B=1. As seen in the truth table 812, B=1 selects only the known values (e.g., the right-hand half of 812), and the selected known values are shown in truth table 814. Truth table 816 shows when C=1 that selects the bottom value of) from the truth table 814.

Figure 9:
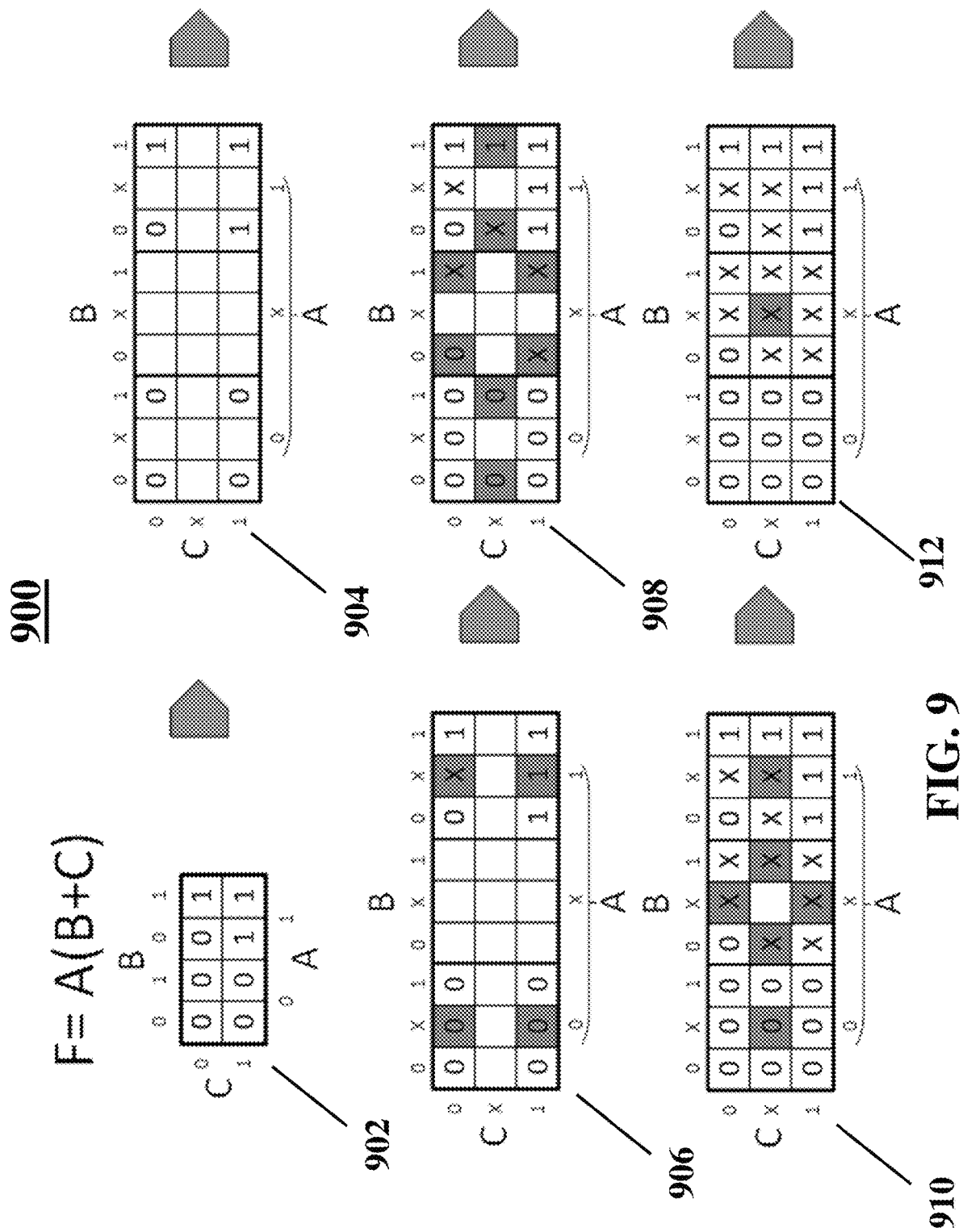
FIG. 9 shows various illustrative truth tables for implementing unknown logic states in a processor of an emulation system, according to an embodiment.

FIG. 9 shows various truth tables 900 showing the process of deriving a ternary table to handle unknown inputs from an original binary table handling only the known inputs. The truth tables 900 shown herein are for the function F=A(B+C), also represented as F=A AND (B OR C).

Truth table 902 is an original binary truth table to evaluate the function F=A(B+C) with the outputs for various combination of inputs. Truth table 904 shows an expanded truth table including outputs for the conditions of A=X, B=X, and/or C=X). Truth table 906 shows the outputs for B=X when A and C are known. In particular, if C=1, then B+C should always generate 1 and A(B+C) is known. However, if C=0, the output is known (0) if A=0. However, the output is unknown if A=1. Truth tables 906, 908, 910, 912 show updated outputs when one or more of the inputs A, B, and C are unknown based upon the principles described herein.

Figure 10:
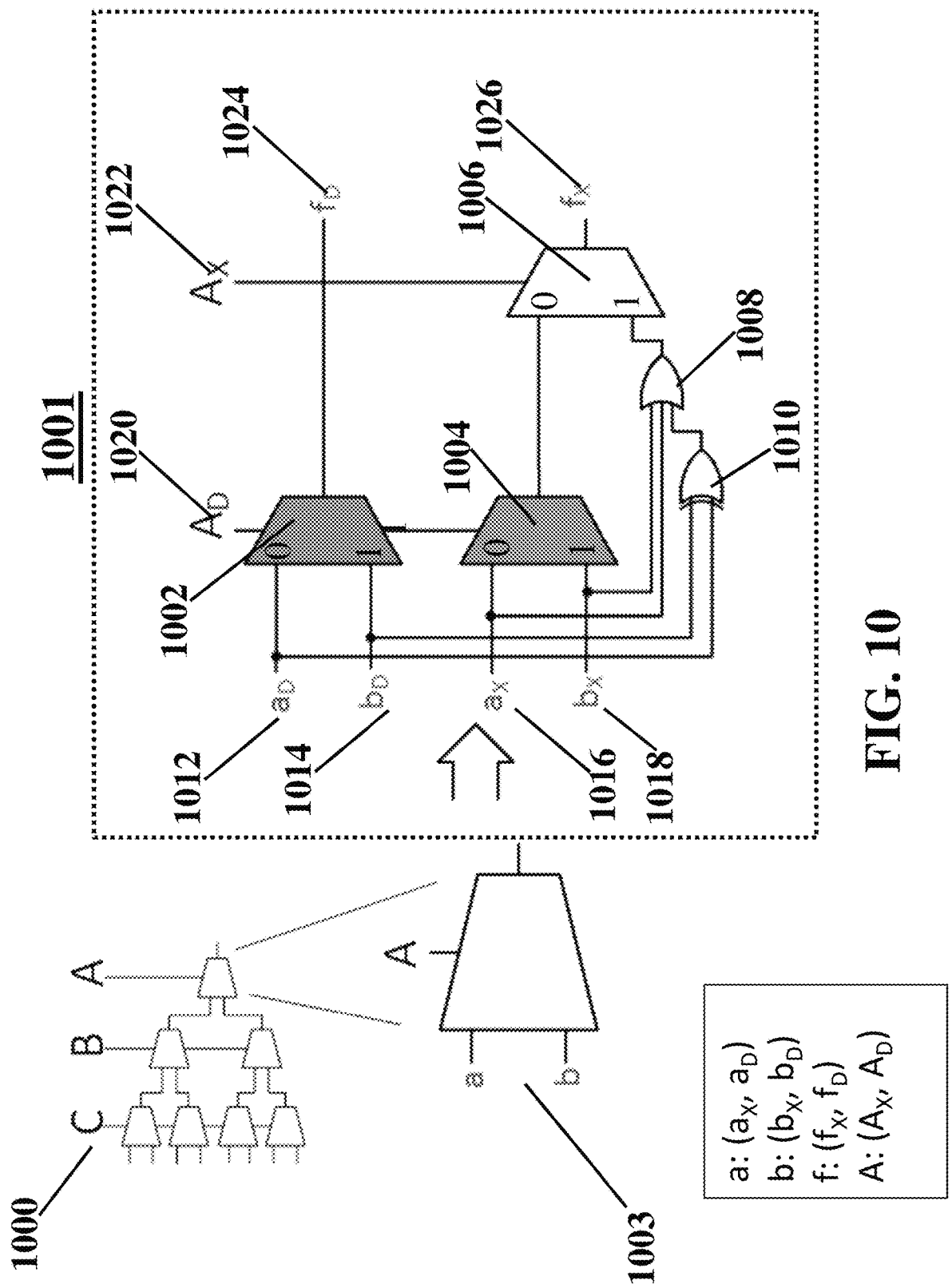
FIG. 10 shows an illustrative electronic circuit of a processor in an emulation system supporting unknown states of input logic signals, according to an embodiment.

FIG. 10 shows an electronic circuit 1001 of an emulation processor configured to emulate both unknown states and known states during an emulation of a DUT. The circuit 1001 of the processor is a significant improvement over each two-way multiplexer 1003 present in a conventional circuit 1000, which cannot correctly manage the unknown states of the input logic signals while executing a task. As described above, an unknown state (X) should be understood to include a high impedance state (Z) as well.

The electronic circuit 1001 may include a collection of various electronic components, and interconnections between the various electronic components that enable the emulation processor to correctly handle both the unknown states and the known states of the various logic signals during an emulation of a DUT. For example, the electronic circuit 1001 may include electrical connections between a plurality of multiplexers and Boolean circuit gates to correctly handle both the unknown states and the known states during the emulation of the DUT. In a non-limiting example, the electronic circuit 1001 may include a first multiplexer 1002, a second multiplexer 1004, a third multiplexer 1006, an OR gate 1008, an XOR gate 1010, and the interconnections between the first multiplexer 1002, the second multiplexer 1004, the third multiplexer 1006, the OR gate 1008, and the XOR gate 1010.

The ternary-logic multiplexer circuit of 1001, combines three ternary values, a, b and A to produce a ternary output f. Each of these values is represented by a pair of binary signals suitable for implementation in binary logic. For the purpose of this implementation, ($a_X$ 1016, $a_D$ 1012) may represent the ternary value of a using the mapping (0,0)→0, (0,1)→1, (1,0)→X and (1,1)→X. It should be understood that the same ternary to binary mapping may be applied to all signals presented and that other mappings are possible, with appropriate modifications to the circuit 1001. In this circuit 1001, the modifications to the standard binary multiplexer to support representations of ternary signals and ternary function table entries may enable an extension of the conventional usage of lookup table for emulation to ternary signals and function tables. In this description, ternary signal A, represented with binary pair ($A_X$, $A_D$) may represent input signals; ternary signals a and b, represented with binary pairs ($a_X$, $a_D$) and ($b_X$, $b_D$) may represent lookup table entries; and ternary signal f, represented with binary pair ($f_X$, $f_D$) may represent the output.

Each of the first multiplexer 1002, the second multiplexer 1004, and the third multiplexer 1006 is a combinational logic circuit that selects one of several input logic signals, and forwards the selected input logic into an output line. In other words, each of the first multiplexer 1002, the second multiplexer 1004, and the third multiplexer 1006 is configured to switch one of several input lines to a single common output line by the application of a control signal. More particularly, the first multiplexer 1002 may receive two inputs, $a_D$ 1012 and $b_D$ 1014 and generate a single output. Each of the two inputs, $a_D$ 1012 and $b_D$ 1014, may represent known values of ternary signals a and b, if they are known. The output of the first multiplexer 1002 is controlled by a selector signal $A_D$ 1020. The selector signal $A_D$ 1020 may also represent the known value of ternary signal A, if indeed A holds a known value.). The known values may represent an initialized and definite variable. An unknown value X may represent an uninitialized variable, or unknown variable. The output of the first multiplexer 1002 is $f_D$ 1024.

The second multiplexer 1004 may receive two inputs $a_X$ 1016 and $b_X$ 1018, and generate a single output. The input $a_X$ 1016 may indicate whether the corresponding input a, comprising $a_D$ 1012 and $a_X$ 1016 is known or unknown. Similarly, the input $b_X$ 1018 may indicate that whether the corresponding input b, comprising $b_D$ 1014 and $b_X$ 1018 is known or unknown. More particularly, if $a_X$ 1016 is asserted high ($a_X$=1), the corresponding input signal a is unknown (a=X). Similarly, if $b_X$ 1018 is asserted high ($b_X$=1), the corresponding input b is unknown (b=X). The output of the second multiplexer 1004 is selected by the selector signal $A_D$1020, which is also the selector for the first multiplexer 1002. The output of the second multiplexer 1004 is fed as an input to a third multiplexer 1006.

The third multiplexer 1006 may receive two inputs and generate a single output. One of two inputs is an output of the second multiplexer 1004 and another input is an output of the OR gate 1008. The output of the third multiplexer 1006 is controlled by a selector signal $A_X$ 1022. The selector signal $A_X$ 1022 is asserted high ($A_X$=1) when the selector signal A is unknown (A=1). The single output of the third multiplexer 1006 is output signal $f_X$ 1026. As described below, the state of output signal $f_X$ 1026 may indicate whether the corresponding output signal f, comprising $f_D$ 1024 and $f_X$ 1026 is known or unknown. More particularly, the output signal $f_X$ 1026 is asserted high ($f_X$=1) when the output signal f is unknown (f=X).

An OR gate 1008 is a digital logic gate with two or more inputs and one output that performs logical disjunction. The output of the OR gate 1008 is true or high output (1) when one or more of its inputs are true or high output (1). If all of the OR gate's 1008 inputs are false or low output (0), then the output of the OR gate is false or low output (0).

As shown in FIG. 10, the OR gate 1008 may receive three inputs (i) $a_X$ 1016, (ii) $b_X$ 1018, and the output of the XOR gate 1010 ($a_D$ XOR $b_D$). The output of the OR gate 1008 is an input to lane 1 the third multiplexer 1006. The XOR gate 1010 (also referred to by its extended name, Exclusive OR gate) is a digital logic gate with two or more inputs, and one output that performs exclusive disjunction. The output of the XOR gate 1010 is true or high output (1) only when exactly one of its inputs is true or high output (1). If both of the XOR gate's 1010 inputs are false or low output (0), or if both of its inputs are true or high output (1), then the output of the XOR gate is false or low output (0). The XOR gate 1010 may receive two inputs $a_D$ 1012 and $b_D$ 1014 and generate a single output that is fed as a third input to the OR gate 1008.

Due to its capacity for handling both the known and unknown states, the electronic circuit 1001 may receive unknown signals from upstream and correctly propagate the result processing the unknown signals downstream during the emulation of the DUT. It should be understood that the inputs to XOR gate 1010 and the OR gate 1008 are sequentially referred from top to bottom. For example, for the OR gate 1008, the first input is $a_X$ 1016, the second input is $b_X$ 1018, and the third input is the output from the OR gate 1010. Similarly, for the XOR gate 1010, the first input is $a_D$ 1012 and the second input is $b_D$ 1012.

The electronic circuit 1001 functions for all the combinations of known and/or input signals to generate the corresponding outputs as detailed below.

Condition A: Inputs: a, b, and A are Known ($a_X$=0, $b_X$=0, and $A_X$=0); Output: f Known ($f_X$=0)

When all of the signals a, b, and A are known ($a_X$ 1016=0, $b_X$ 1018=0, and $A_X$ 1022=0), the electronic circuit 1001 has to generate a known output f ($f_X$ 1026=0). For the output $f_D$ 1024, the selector $A_D$ 1020 may select one of the inputs $a_D$ 1012 or $b_D$ 1014 coming in to the first multiplexer 1002. Because $A_X$ 1022=0, $A_X$ 1022 will always select input line 0 of the third multiplexer 1006. The input line 0 of the third multiplexer is the output line of the second multiplexer 1004. Inputs to each of the input lines to the second multiplexer 1004 is 0 because $a_X$ 1016=0, $b_X$ 1018=0 and therefore the output is always 0. Thus, the input line 0 for the third multiplexer 1006 is always 0, which is selected by the selector $A_X$ 1022, thereby generating an output $f_X$ 1026=0. It should be noted that this behavior is the identical behavior in the in the case that to ternary signals are modeled and all signals and lookup tables are binary.

Condition B: Inputs: a, b are Known ($a_X$=0, $b_X$=0) and A is Unknown ($A_X$=1); Output: f is Known ($f_X$=0) if $a_D$=$b_D$ and f is Unknown ($f_X$=1) if $a_D$≠$b_D$ For $a_D$ 1012=$b_D$ 1014, the XOR gate 1010 will always generate an output of 0, which is the third input to the OR gate 1008. As $a_X$ 1016=0 and $b_X$ 1016=0, the first and second inputs to the OR gate 1008 are also 0s. Therefore the input line 1 for the third multiplexer 1006 will always be 0. Furthermore, as $A_X$ 1022=1, the input line 1 will always be selected thereby generating an output of $f_X$ 1026=0 indicating that the output f is known. In this case, the value of f will be determined by the component $f_D$ 1024 which is appropriately selected by $A_D$ 1020 from $a_D$ 1012 and $b_D$ 1014 as indicated in condition A above.

For $a_D$ 1012≠$b_D$ 1014, the XOR gate 1010 will always generate an output of 1, which is the third input to the OR gate 1008. The output from the OR gate 1008 is always 1, regardless of the first and second inputs to the OR gate 1008. Therefore, the input line 1 of the third multiplexer 1006 is always 1 and is always selected by the selector $A_X$ 1022=1 to generate an output of $f_X$ 1026=1 indicating that the output f is unknown. In this case, the value of $f_D$ 1024 may not influence the interpretation of f because f represents an unknown value.

Condition C: Inputs: a is Known ($a_X$=0), b is Unknown ($b_X$=1) and A is Known ($A_X$=0); Output: f is Known ($f_X$=0) if $A_D$=0 and f is Unknown ($f_X$=1) if $A_D$=1

For selector $A_D$ 1020=0, the selector $A_D$ 1020 will always select input line 0 ($a_D$ 1012) of the first multiplexer 1002 to generate a known output f. Because the selector $A_X$ 1022=0, the selector $A_X$ 1022 will always select the input line 0 for the third multiplexer 1006. The input line 0 for the third multiplexer 1006 will always receive the input signal $a_X$ 1016=0 because the selector $A_D$ 1020=0 for the second multiplexer 1004. As the selector $A_X$ 1022 always selects the input line 0 for the third multiplexer 1006, the output $f_X$ 1026=0 indicating that f is known.

For selector $A_D$ 1020=1, the selector $A_D$ 1020 will always select input line 1 ($b_D$1014) of the first multiplexer 1002 to generate an unknown output f. Because the selector $A_X$ 1022=0, the selector $A_X$ 1022 will always select the input line 0 for the third multiplexer 1006. The input line 0 for the third multiplexer 1006 will always receive the input signal $b_X$ 1016=1 because the selector $A_D$ 1020=1 for the second multiplexer 1004. As the selector $A_X$ 1022 always selects the input line 0 for the third multiplexer 1006, the output $f_X$ 1026=1 indicating that f is unknown.

Condition D: Inputs: a is Unknown ($a_X$=1), b is Known ($b_X$=0) and A is Known ($A_X$=0); Output: f is Unknown ($f_X$=1) if $A_D$=0 and f is Known ($f_X$=0) if $A_D$=1

For selector $A_D$ 1020=0, the selector $A_D$ 1020 will always select input line 0 ($a_D$1012) of the first multiplexer 1002 to generate an output $f_D$ 1024. Because the selector $A_X$ 1022=0, the selector $A_X$ 1022 will always select the input line 0 for the third multiplexer 1006. The input line 0 for the third multiplexer 1006 will always receive the input signal $a_X$ 1016=1 because the selector $A_D$ 1020=0 for the second multiplexer 1004. As the selector $A_X$ 1022 always selects the input line 0 for the third multiplexer 1006, the output $f_X$ 1026=1 indicating that f is unknown.

For selector $A_D$ 1020=1, the selector $A_D$ 1020 will always select input line 1 ($b_D$1014) of the first multiplexer 1002 to generate an output $f_D$ 1024. Because the selector $A_X$ 1022=0, the selector $A_X$ 1022 will always select the input line 0 for the third multiplexer 1006. The input line 0 for the third multiplexer 1006 will always receive the input signal $b_X$ 1016=0 because the selector $A_D$ 1020=1 for the second multiplexer 1004. As the selector $A_X$ 1022 always selects the input line 0 for the third multiplexer 1006, the output $f_X$ 1026=0 indicating that f is known.

Condition E: Inputs: a and b are Unknown ($a_X$=1 and $b_X$=1); Output: f is Unknown ($f_X$=1)

If both of the inputs a and b are unknown, then the output f should be unknown regardless of whether A is known or unknown. Because the output $f_X$ 1026 must always be 1, the output of the third multiplexer 1006 must always be 1. Therefore, both of the input lines to the third multiplexer 1006 should receive 1. With respect the input line 0 of the third multiplexer, because both $a_X$ 1016=1 and $b_X$ 1018=1, the output of the second multiplexer 1004 and therefore the input line 0 of the third multiplexer 1006 should always be 1. With respect to the input line 1 of the third multiplexer 1006, because $a_X$ 1016=1 and $b_X$ 1018=1, the output of the OR gate 1008 is always 1 and therefore input line 1 of the third multiplexer 1006 should always be 1. Therefore, the output $f_X$ 1026=1, regardless of the value of the selector $A_X$ 1022 indicating that the output f is unknown.

The above description of the circuit implementation realizes the desired behavior when a pair of binary signals is used to represent each ternary signal: When A represents a known value, f is determined by A selecting between a and b regardless of whether their values represent known or unknown values. When A represents an unknown value, the result f is determined as unknown if either of a or b are unknown or if they differ from each other. Conversely, when a and b hold the same known value, f receives this value even if the selector A represents an unknown.

In addition to logic inputs with unknowns (e.g., a and b as above), the circuit 1001 (and other embodiments described throughout this disclosure) may support function tables that contain unknowns. For example, the circuit 1001 may model special cases of outputs that may be X regardless of whether the input contains Xs. Furthermore, the circuit 1001 may support lookup tables that contain Xs. A lookup table may indicate a relationship between a particular set of inputs to a corresponding set of outputs. The lookup table may therefore allow a user to specify the input to output relationships without having to generate specific gate-level combinational logic. The circuit 1001 may be configured to model behavior of a lookup table containing one or more X inputs and/or one or more X outputs.

Figure 11:
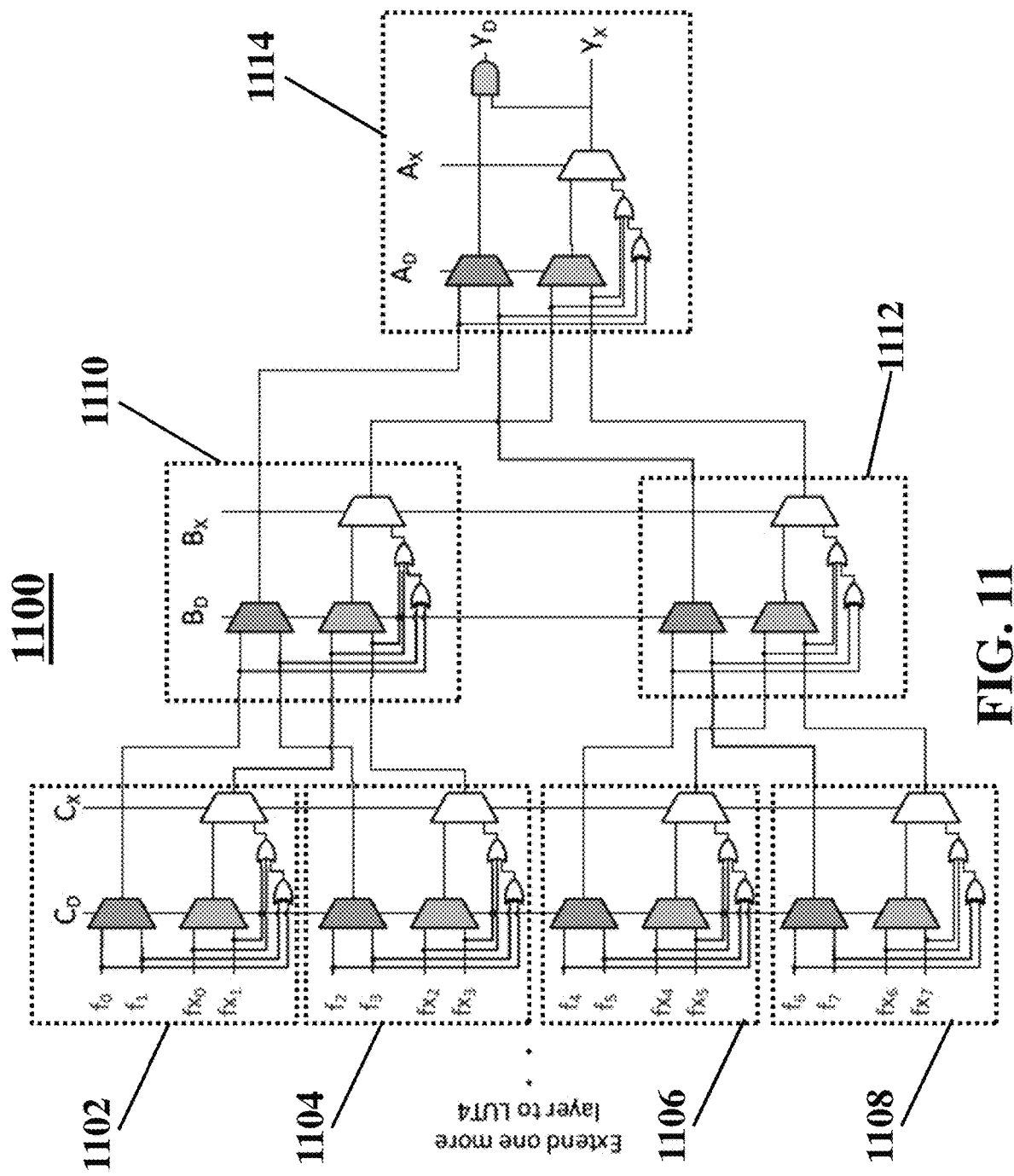
FIG. 11 shows an illustrative cascade of electronic circuits in a processor supporting unknown states of input logic signals, according to an embodiment.

FIG. 11 shows a cascade of electronic circuits 1100 of an emulation processor supporting four state logic emulation. The cascade of the electronic circuits 1100 may include a first electronic circuit 1102, a second electronic circuit 1104, a third electronic circuit 1106, a fourth electronic circuit 1108, a fifth electronic circuit 1110, a sixth electronic circuit 1112, and a seventh electronic circuit 1114. Each of the first electronic circuit 1102, the second electronic circuit 1104, the third electronic circuit 1106, the fourth electronic circuit 1108, the fifth electronic circuit 1110, the sixth electronic circuit 1112, and the seventh electronic circuit 1114 may include a collection of various electronic components and interconnections between the various electronic components that enable the emulation processor to support four state logic emulation.

In some embodiments, each of the first electronic circuit 1102, the second electronic circuit 1104, the third electronic circuit 1106, the fourth electronic circuit 1108, the fifth electronic circuit 1110, the sixth electronic circuit 1112, and the seventh electronic circuit 1114 may include an electrical connection between multiple multiplexers and multiple different types of Boolean gates to support both the unknown states and the known states during an emulation. In one non-limiting example, each of the first electronic circuit 1102, the second electronic circuit 1104, the third electronic circuit 1106, the fourth electronic circuit 1108, the fifth electronic circuit 1110, the sixth electronic circuit 1112, and the seventh electronic circuit 1114 may include a first multiplexer, a second multiplexer, a third multiplexer, an OR gate, a XOR gate, and various interconnections between the first multiplexer, the second multiplexer, the third multiplexer, the OR gate, and the XOR gate. The structure and operation of each of the first electronic circuit 1102, the second electronic circuit 1104, the third electronic circuit 1106, the fourth electronic circuit 1108, the fifth electronic circuit 1110, the sixth electronic circuit 1112, and the seventh electronic circuit 1114 is described in FIG. 10.

Based on the operation of each of the electronic circuits 1102, 1104, 1106, 1106, 1108, 1110, 1112, 1114, both known and unknown outputs are propagated through the emulation processor, based upon the principles described with respect to FIG. 10.

The seventh and final electronic circuit 1114 may include one additional AND gate. This AND gate modifies the output of the cascade in the case where the output Y represents an unknown value ($Y_X$=1) such that $Y_D$=0 because the value of $Y_D$ is meaningless in this case in and it is desirable to canonicalize the representation to a single pair ($Y_X$,$Y_D$)=(1,0) when Y represents unknown.

Figure 12:
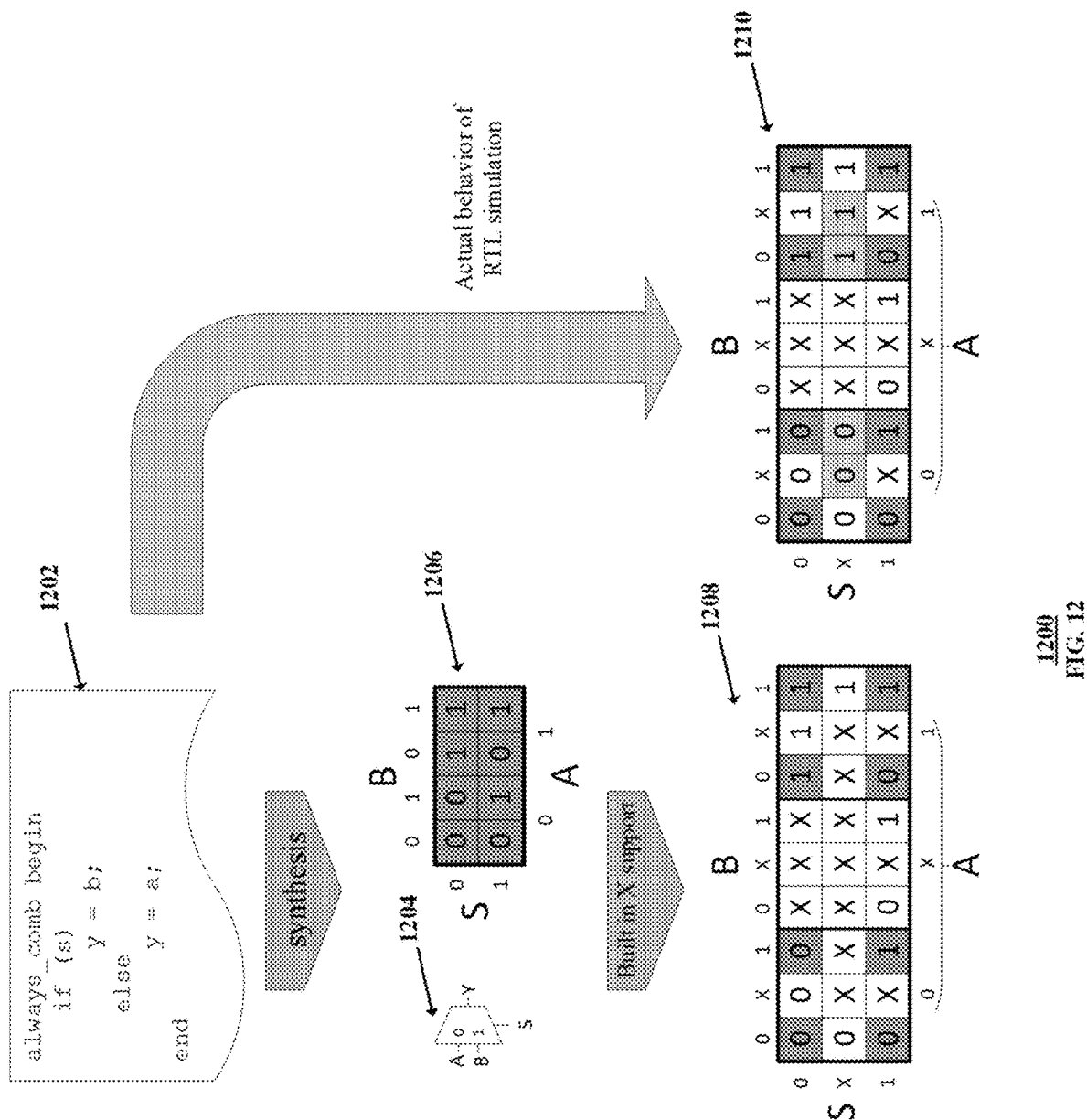
FIG. 12 shows an illustrative process diagram for synthesizing a combinational circuit device supporting unknown logic states.

FIG. 12 shows a process diagram 1200 of an emulation system configured to support unknown logic states in a register transfer level (RTL) synthesis. A user may provide a hardware description language program 1202 of the multiplexer 1204. The hardware description language program 1202 indicates that the multiplexer should output the value of B if S=1 and output the value of A if S=1. Truth table 1206 may be generated conventionally without a capacity to support unknown logic states. The emulation system described herein can synthesize the multiplexer 1204 with a built in unknown state X support as shown in truth table 1208. The emulation system may also synthesize the multiplexer for an RTL simulation as shown in truth table 1210.

In particular, truth table 1208 shows an actual hardware behavior (or default synthesized behavior) where the emulation processor, for an unknown s, generates a known output if A and B are known and equal and generates an unknown output if A and B are unequal. More combinations of the inputs are described in reference to FIG. 10. The emulation system may also support the RTL simulation behavior where the emulation processor, if s is unknown, does not take the first branch (because s≠1 and therefore the unknown value of s is treated as s=0) and takes the second branch thereby outputting the value of A. The RTL simulation behavior is shown in truth table 1210. The emulation system may include a configuration logic to allow a user to configure the emulation system between the RTL simulation behavior or the default synthesized behavior. For example, the user may use options in the configuration logic to instruct the emulation system to treat the unknown s as 0 or 1.

Figure 13:
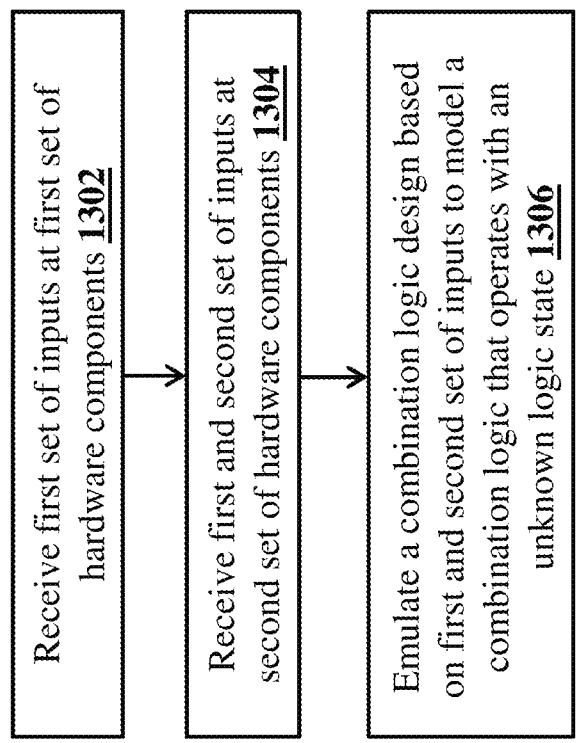
FIG. 13 shows an illustrative method of emulating a logic design with unknown logic states, according to an embodiment.

FIG. 13 shows execution steps for processing an input logic signal in an emulation system, according to a method 1300. The method 1300 includes execution steps 1302, 1304, and 1306. However, other embodiments may include additional or alternative execution steps or may omit one or more steps altogether. The other embodiments may perform certain execution steps in a different order; steps may also be performed simultaneously or near-simultaneously with one another. In addition, the method 1300 is described as being executed by emulation processor in this embodiment. However, in some embodiments, steps may be executed by any number of processors operating in a distributed computing environment. In some cases, a processor executing one or more steps may be programmed to execute various other, unrelated features, where such processor does not need to be operating strictly as the emulation processor described herein.

At a first step 1302, a processor including a first set of hardware components may receive a first set of inputs. The first set of hardware components may include multiplexers. The first set of hardware components may further include Boolean circuit gates. A collection of the multiplexers and the Boolean circuit gates may receive the first set of inputs.

At a next step 1304, a processor including a second set of hardware components receive second set of inputs. The second set of hardware components may include multiplexers. The second set of hardware components may further include Boolean circuit gates. In other words, a collection of the multiplexers and the Boolean circuit gates may receive the first set of inputs and the second set of inputs. The first set of inputs may have at least one signal with an unknown state, as shown in FIG. 10. The second set of inputs may indicate the known/unknown state of the first set of inputs, also shown in FIG. 10.

At a next step 1306, the first set of hardware components and the second set of hardware components may emulate a combinational logic design. The combinational logic design may include both known and unknown logic sates. The first and second set of hardware components may be integrated to form an integrated set of hardware components. Various interconnections may be formed between the first set of hardware components and the second set of hardware components to generate the integrated set of hardware components. In some embodiments, a predetermined interconnection process may be executed in order to form the various interconnections between the first set of hardware components and the second set of hardware components to generate the integrated set of hardware components. The integrated set of hardware components may then emulate a combinational logic design.

An emulation processor may be configured to support synchronous circuit devices (e.g., a flip-flop, also referred to as a flop) with unknown signal (X) propagation behavior. In other words, the emulation processor during emulation may be able to emulate a behavior of a synchronous circuit device with one or more inputs being an unknown signal. For synchronous operations of synchronous circuit devices, the emulation processor may be configured to support three modes of operation: (i) a "register transfer level" (RTL) mode, (ii) a "computer as ternary" (CAT) mode, and (iii) a "forward only X" (FOX) mode.

In an RTL mode of operation, the emulation processor may emulate an RTL behavior of a flop as described in the hardware description language such as VHDL or Verilog. For example, a flop behavior may be modeled in RTL by an HDL code shown in TABLE I.

TABLE I

| HDL code describing an RTL behavior of a flop |
|---|
| always @(posedge clk or posedge rst)<br>  if (rst)<br>    q <= 0;<br>  else<br>    q <= d; |

The flop described by HDL code shown in TABLE I may be for a flop triggered by a positive edge of a clock signal or a positive edge of the reset signal. In an RTL behavior, the emulation processor may trigger a positive edge expression when there is a transition from 0→X or X→1. Similarly, the emulation processor may trigger a negative edge expression when there is a transition from 1→X or X→0. Meanwhile, in an if statement, the emulation processor may not take the positive branch when the condition is X.

However, the actual hardware behavior to be emulated by the emulation processor may correspond to the CAT mode. For example, if the clock signal transitions form 0→X, it may be more appropriate to model not knowing whether there is an edge or not. This means that the flop takes on the value of input/output if the input and the output are the same, but if they differ, the output should be X. The CAT mode may be described by an Xresolve function defined as Xresolve (a,b):=a if (a==b), otherwise X.

Figure 14:
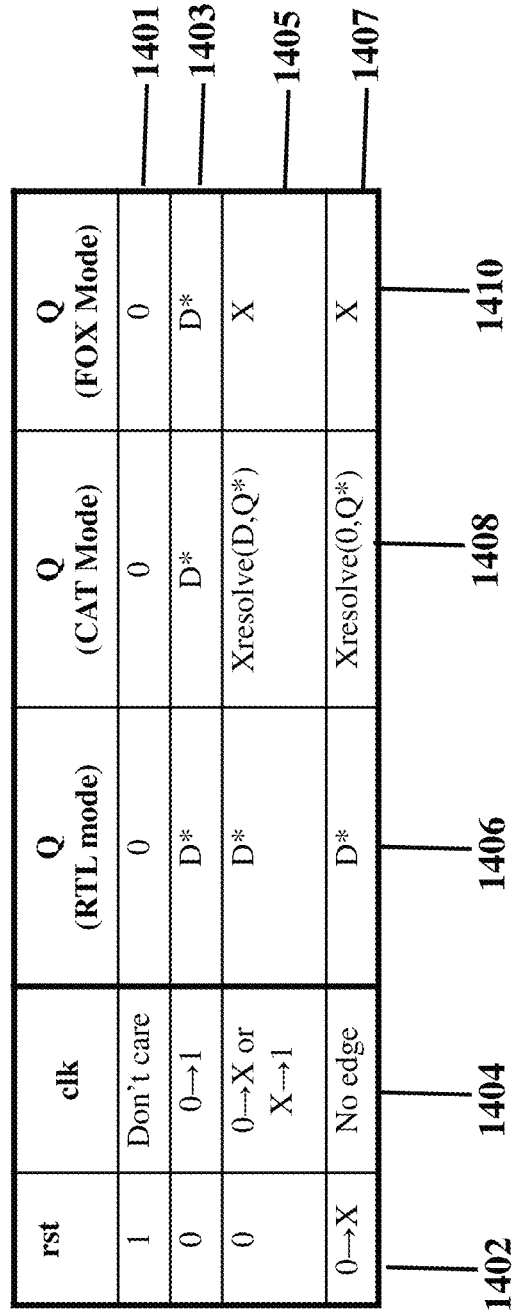
FIG. 14 shows a table with illustrative outputs of a circuit of a processor in an emulation system supporting unknown logic states of synchronous circuits, according to an embodiment.

FIG. 14 is a table 1400 showing a behavior of an asynchronous reset flop. Column 1402 shows a state or transition of the rst (reset signal), column 1404 shows the state or transition of the clk (clock signal), column 1406 shows the behavior of the flop in an RTL mode, column 1408 shows the behavior of the flop in a CAT mode, and column 1410 shows the behavior of the flop in a FOX mode.

Row 1401 shows a condition where a reset is asserted. As the flop is being reset, the output should be 0, regardless of the mode of the operation of the flop. Row 1403 shows a condition when reset signal is not asserted and the clock signal is transitioning from 0 to 1. There are no unknown control inputs here, so the output Q of the flop is the input D* for all modes of operations. Row 1405 shows a condition where the reset signal is not asserted and the clock signal transition is unknown. In other words, the clock signal may be transitioning from 0 to X or from X to 1. Because the X condition may represent either a 0 or a 1, it is not even known whether there is a positive transition or not. In an RTL mode, the emulation processor may take the second branch, as shown in TABLE I, generate the output Q=D*. In the CAT mode, the emulation processor may run a combinational logic to perform Xresolve(D,Q*) to generate output as D* if D=Q* and X if D≠Q*. In the FOX mode, the emulation processor may simply generate a pessimistic X output.

Row 1407 shows a condition when the reset is signal is unknown, e.g., the reset signal transitioning from 0 to X and the clock signal having no edge. The clock signal may not matter because of the asynchronous reset. In the RTL mode, the emulation processor takes the second branch, as shown in TABLE I, and generates the output Q=D*. In the CAT mode, the emulation processor may run a combinational logic to perform Xresolve(0,Q*) to generate output as D* (0) if D (0)=Q*(0) and X if D≠Q*. In the FOX mode, the output is pessimistic X.

FIG. 15 is a table 1500 showing a behavior of a synchronous reset flop. Column 1502 shows a state or transition of the rst (reset signal), column 1504 shows the state or transition of the clk (clock signal), column 1506 shows the behavior of the flop in an RTL mode, column 1508 shows the behavior of the flop in a CAT mode, and column 1510 shows the behavior of the flop in a FOX mode.

Row 1501 shows a condition in which the reset signal is not asserted and the clock signal is transitioning from 0 to 1. Therefore the output Q is the input D* for all the modes. Row 1503 shows a condition in which the reset signal is asserted and the clock is transitioning from 0 to 1. As all the input signals are known and the reset signal is asserted, the output is 0 for all the modes. Rows 1505, 1507, 1509, 1511 show conditions where one or more of the reset signal and the presence of clock transition may be unknown. For the FOX mode, the result is always the pessimistic X because at least one of relevant control is unknown. Other modes are detailed below.

In row 1505, the reset signal is X and the clock is transitioning from 0 to 1. In the RTL mode, the emulation processor may take a second branch of the HDL code (because rst≠1) to generate the output of Q=D*. However, the CAT mode, the emulation processor may perform the Xresolve (0, D*) to generate output as D* (0) if D (0)=Q*(0) and X if D≠Q*. In row 1507, the reset signal is 0 but the clock transition is unknown. In the RTL mode, the emulation processor may take the second branch (because rst≠1) to generate the output of Q=D*. In the CAT mode, the emulation processor may perform the Xresolve (D*, Q*) to generate output as D* if D*=Q* and X if D*≠Q*. In row 1509, the reset signal is 1 but the clock transition is unknown. In the RTL mode, the emulation processor may take the first branch in the HDL code to reset the output to zero. However, the CAT mode, the emulation processor may perform the Xresolve (0, D*) to generate output as D* (0) if D* (0)=Q*(0) and X if D*≠Q*. In row 1511, both of the reset and clock transitions are unknown. In the RTL mode, the emulation processor may take a second branch of the HDL code (because rst≠1) to generate the output of Q=D*. In the CAT mode, the emulation processor may perform the Xresolve (0, D*, Q*) to generate the output as D*(0) if D* (0)=Q*(0)=0 and X if D*≠Q*≠0.

Figure 16:
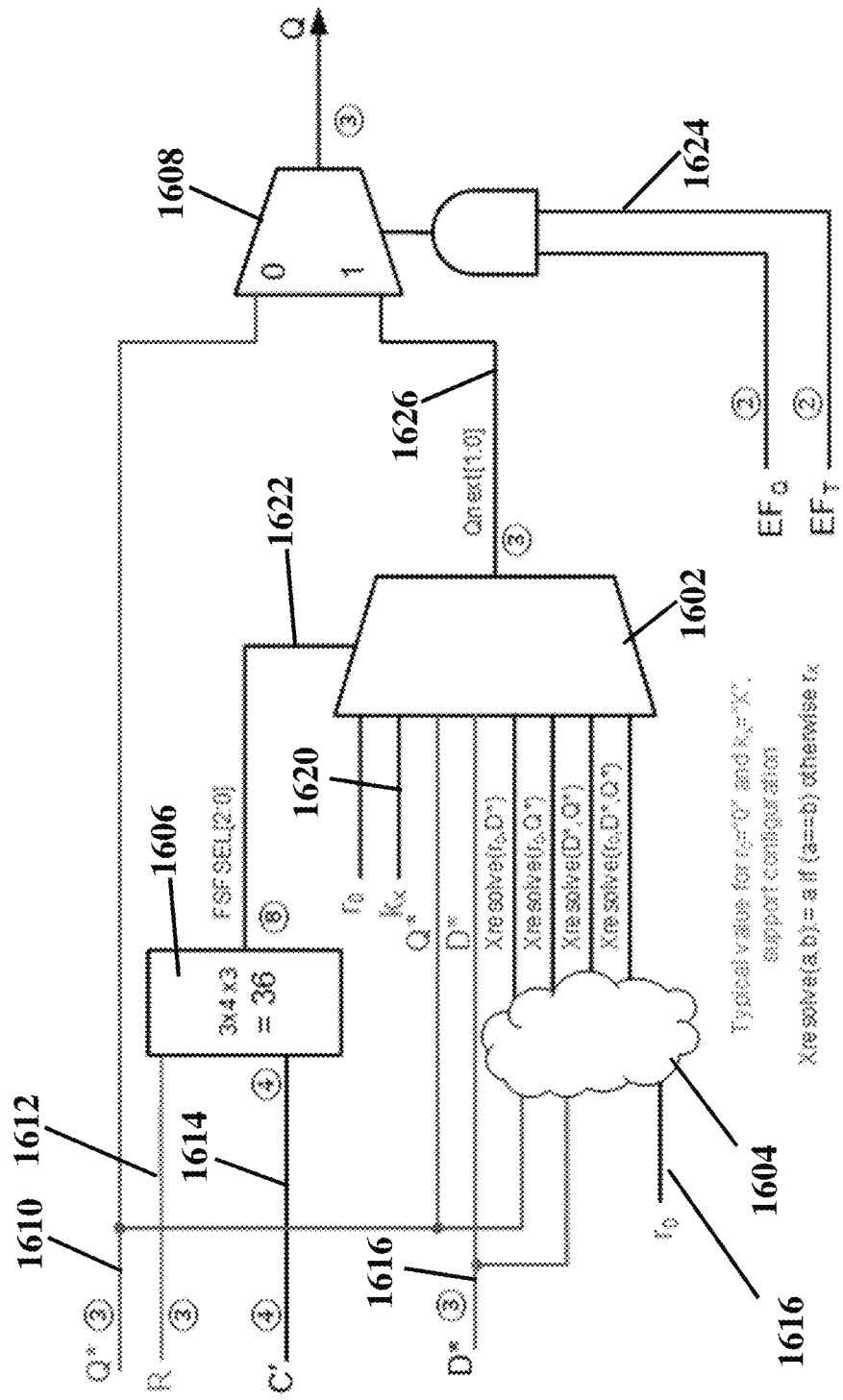
FIG. 16 shows an illustrative circuit of a processor in an emulation system supporting unknown logic states of synchronous circuits, according to an embodiment.

FIG. 16 shows an illustrative circuit 1600 configured to implement the synchronous operations described above. The circuit 1600 may comprise a multiplexer 1602 configured to select between various inputs including input signal D* 1616, output signal Q* 1610, clock signal $k_X$ 1620 and the results of performing the Xresolve function from a combinational logic 1604. An instrumentation signal C' 1614 that may represent up to four different types of clock transitions (e.g., no transition, 0→1, 0→X, or X→1), together with the value of R 1612 provides an address in a memory 1606 to generate a selector signal 1622 to the multiplexer 1602. The selection of various logic values by the multiplexer 1602 based on the selector signal 1622 have been described in reference to the tables 1400 in FIG. 14 and table 1500 in FIG. 16. Finally multiplexer 1608 selects between a known signal Q* 1610 arriving at input line 0 or an input 1626 based on one or more unknown values based on the signals 1624 received from other portions of the emulation processor. In this way, the circuit implements sufficient configurability that it can be used to implement any of the desired flop-like behaviors in the presence of ternary signals described in FIG. 14 or FIG. 15.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A logic emulation system comprising:
at least one processor configured to emulate a circuit design by a circuit that operates with an unknown logic state, the processor including:
a first multiplexer having a first input configured to receive a first ternary signal, and a second input configured to receive a second ternary signal,
a second multiplexer having a first input configured to receive the first ternary signal, and a second input configured to receive the second ternary signal, and
a third multiplexer having a first input coupled with an output of the second multiplexer, a second input configured to receive input based on the first ternary signal and the second ternary signal, and an output configured to indicate whether an output of the first multiplexer is known or unknown,
wherein the processor is configured to receive, at one or more of the first multiplexer and the second multiplexer, an unknown reset signal associated with a signal transition of one or more devices of the circuit, and a selector signal for selecting one or more of the first ternary signal and the second ternary signal, the first ternary signal and the second ternary signal associated with combinational logic of the circuit design, and
the processor is further configured to emulate an output of the one or more devices having a known logic state in a mode selected from a plurality of modes of operation, the plurality of modes of operation configured to resolve a behavior of a flip-flop of the combinational logic with the known logic state, the unknown logic state, and the unknown reset signal.

2. The logic emulation system of claim 1, wherein the unknown logic state is an unknown logic state (X).

3. The logic emulation system of claim 1, wherein the circuit is a combination logic circuit.

4. The logic emulation system of claim 1, wherein the the processor is configured to receive at least one unknown binary signal and at least one indicator signal indicating a status of the unknown binary signal.

5. The logic emulation system of claim 1, wherein the circuit is a sequential logic circuit.

6. The logic emulation system of claim 5, wherein the processor is configured to receive an unknown clock signal.

7. The logic emulation system of claim 1, wherein the processor is configured to receive one or more of the first ternary signal and the second ternary signal from upstream logic of the processor.

8. The logic emulation system of claim 1, wherein the processor is further configured to emulate a register transfer level simulation of a portion of the circuit design based upon a first configuration option.

9. The logic emulation system of claim 8, wherein the processor is further configured to emulate default synthesized behavior of the portion of the circuit design based upon a second configuration option.

10. An emulation method comprising:
emulating, by the processor, a circuit design by a circuit that operates with an unknown logic state, the processor including:
a first multiplexer having a first input configured to receive a first ternary signal, and a second input configured to receive a second ternary signal,
a second multiplexer having a first input configured to receive the first ternary signal, and a second input configured to receive the second ternary signal, and
a third multiplexer having a first input coupled with an output of the second multiplexer, a second input configured to receive input based on the first ternary signal and the second ternary signal, and an output configured to indicate whether an output of the first multiplexer is known or unknown;
receiving, by the processor at one or more of the first multiplexer and the second multiplexer, an unknown reset signal associated with a signal transition of one or more devices of the circuit, and wherein the plurality of inputs further includes a selector signal for selecting one or more of the first ternary signal and the second ternary signal, the first ternary signal and the second ternary signal associated with combinational logic of the circuit design; and emulating, by the processor, an output of the one or more devices having a known logic state in a mode selected from a plurality of modes of operation, the plurality of modes of operation configured to resolve a behavior of a flip-flop of the combinational logic with the known logic state, the unknown logic state, and the unknown reset signal.

11. The method of claim 10, wherein the unknown logic state is an unknown logic state (X).

12. The method of claim 10, wherein the circuit is a combination logic circuit.

13. The method of claim 10, wherein the the processor is configured to receive at least one unknown binary signal and at least one indicator signal indicating a status of the unknown binary signal.

14. The method of claim 10, wherein the circuit is a sequential logic circuit.

15. The method of claim 14, wherein the processor is configured to receive an unknown clock signal.

16. The method of claim 10, wherein the processor is configured to receive one or more of the first ternary signal and the second ternary signal from upstream logic of the processor.

17. The method of claim 10, further comprising:

emulating, by the processor, a register transfer level simulation of a portion of the circuit design based upon a first configuration option.

18. The method of claim 17, further comprising:

emulating, by the processor, default synthesized behavior of the portion of the circuit design based upon a second configuration option.

* * * * *